United States Patent
Wen et al.

(10) Patent No.: US 7,962,822 B2
(45) Date of Patent: Jun. 14, 2011

(54) GENERATING DEVICE, GENERATING METHOD, PROGRAM AND RECORDING MEDIUM

(75) Inventors: Xiaoqing Wen, Fukuoka (JP); Seiji Kajihara, Fukuoka (JP); Kohei Miyase, Fukuoka (JP); Yoshihiro Minamoto, Fukuoka (JP); Hiroshi Date, Fukuoka (JP)

(73) Assignees: Japan Science & Technology Agency, Kawaguchi-Shi, Saitama (JP); Kyushu Institute of Technology, Kitakyushu-Shi, Fukuoka (JP); System JD Co., Ltd., Fukuoka-Shi, Fukuoka (JP)

( * ) Notice: Subject to any disclaimer, the term of this patent is extended or adjusted under 35 U.S.C. 154(b) by 290 days.

(21) Appl. No.: 12/235,628

(22) Filed: Sep. 23, 2008

(65) Prior Publication Data

US 2009/0019327 A1 Jan. 15, 2009

Related U.S. Application Data

(63) Continuation-in-part of application No. PCT/JP2007/056149, filed on Mar. 26, 2007.

(30) Foreign Application Priority Data

Mar. 28, 2006 (JP) .................................. 2006-088695

(51) Int. Cl.
 *G01R 31/28* (2006.01)
(52) U.S. Cl. ......... 714/738; 714/726; 714/729; 714/741
(58) Field of Classification Search .................. 714/738, 714/726, 729, 741
 See application file for complete search history.

(56) References Cited

U.S. PATENT DOCUMENTS

| | | | |
|---|---|---|---|
| 5,930,149 A * | 7/1999 | Takahashi | 716/2 |
| 6,067,651 A * | 5/2000 | Rohrbaugh et al. | 714/738 |
| 6,751,767 B1 * | 6/2004 | Toumiya | 714/738 |
| 6,986,090 B2 * | 1/2006 | Hathaway et al. | 714/727 |
| 7,027,947 B2 | 4/2006 | Maruyama | |
| 7,188,287 B2 | 3/2007 | Matsuda et al. | |
| 7,428,681 B2 * | 9/2008 | Kang et al. | 714/738 |
| 7,509,550 B2 * | 3/2009 | Rajski et al. | 714/732 |
| 2009/0083593 A1 * | 3/2009 | Wen et al. | 714/726 |
| 2009/0249147 A1 * | 10/2009 | Rajski et al. | 714/742 |

OTHER PUBLICATIONS

Miyase et al., Don't-Care Identification Specific Bits of Test Patterns, 2002, IEEE, pp. 1-6.*

(Continued)

*Primary Examiner* — John J Tabone, Jr.
(74) *Attorney, Agent, or Firm* — Rankin Hill & Clark LLP

(57) ABSTRACT

A generation apparatus and the like for generating a test vector set capable of reducing differences in a logic value generated before and after a scan capture for outputs from scan cells included in a full-scan sequential circuit are provided. A generation apparatus 200 generating an initial test vector set 216 for a logic circuit includes a target vector identification unit 204 identifying a test vector satisfying a predetermined criterion and to be selected for the number of bits (the number of bit transitions) whose logic values differ before and after scan capture with respect to outputs from scan cells included in the sequential circuit, from among test vectors in the initial test vector set 216, and a test vector set conversion unit 206 converting the test vector identified by the test vector identification unit 204 and to be selected so as to reduce the number of bit transitions with respect to outputs from the scan cells included in the sequential circuit.

19 Claims, 16 Drawing Sheets

OTHER PUBLICATIONS

Wen et al., A new ATPG method for efficient capture power reduction during scan testing, Apr. 30, 2006, IEEE, pp. 1-6.*

Wang, LT-RTPG: A New Test-Per-Scan BIST TPG for Low Heat Dissipation, 1999, IEEE, paper4.2, pp. 85-94.*

Li et al., On Reducing Peak Current and Power During Test, 2005, IEEE, pp. 1-6.*

Wen et al., Low-Capture-Power Test Generation for Scan-Based At-Speed Testing, 2005, IEEE, pp. paper 39.2, 1-10.*

Butler et al., Minimizing Power Consumption in Scan Testing: Pattern Generation and DFT Techniques, 2004, IEEE, Paper 12.4, pp. 355-364.*

Rosinger et al., Scan architecture with mutually exclusive scan segment activation for shift- and capture-power reduction, Jul. 2004, IEEE, vol. 23 Issue: 7, pp. 1142-1153.*

Wang et al., ATPG for Heat Dissipation Minimization During Test Application, Feb. 1998, IEEE Transactions on Computers, vol. 47, No. 2, pp. 256-262.*

Wang et al., An Automatic Test Pattern Generator for Minimizing Switching Activity During Scan Testing Activity, Aug. 2002, IEEE Transactions on Computer-Aided Design of Integrated Circuits and Systems, vol. 21, No. 8, pp. 954-.*

International Search Report for PCT/JP2007/056149 dated Jun. 12, 2007.

* cited by examiner

|   | HCP Vector? | Fault Classification | | | Target Fault List $F_{tar}(vi)$ |
|---|---|---|---|---|---|
| v1 | Y | (f1) | (f6) | ☐f9 ☐f10 | f1 f6 f9 |
| v2 | N | f2 | f11 | | |
| v3 | N | f3 | f12 | | |
| v4 | Y | (f4) | (f7) | (f8) f12 | f4 f7 f8 |
| v5 | Y | (f5) | f10 | f11 | f5 f10 |

○ : vector-essential fault   ☐ : set-essential fault

Fig.6

| Circuit | Fault Cov. (%) | Original | | LCP Test Generation (c_limit = 50% Ori. Max. Trans.) | | | |
|---|---|---|---|---|---|---|---|
| | | # of Vec. | Max. Trans. | # of Vec. | Max. Trans. | Red. Rate (%) | CPU (Sec.) |
| s1238 | 94.9 | 125 | 18 | 132 | 12 | 33.3 | 0.4 |
| s1423 | 99.1 | 24 | 49 | 38 | 29 | 40.8 | 0.6 |
| s5378 | 99.1 | 100 | 102 | 112 | 86 | 15.7 | 1.5 |
| s9234 | 93.5 | 111 | 124 | 158 | 100 | 19.4 | 5.0 |
| s13207 | 98.5 | 235 | 380 | 236 | 287 | 24.5 | 16.9 |
| s15850 | 96.7 | 97 | 282 | 140 | 171 | 39.4 | 36.2 |
| s35932 | 89.9 | 12 | 1548 | 15 | 922 | 40.4 | 73.0 |
| s38417 | 99.5 | 87 | 590 | 172 | 492 | 16.6 | 88.6 |
| s38584 | 95.9 | 114 | 925 | 155 | 459 | 50.4 | 141.1 |

Fig.13

GENERATING DEVICE, GENERATING METHOD, PROGRAM AND RECORDING MEDIUM

CROSS-REFERENCE TO RELATED APPLICATIONS

This application is a Continuation-In-Part of PCT International application Serial No. PCT/JP2007/056149 filed Mar. 26, 2007, which is based upon and claims the benefit of priority from prior Japanese Patent Application No. 2006-088695, filed Mar. 28, 2006, the entire contents of both applications are incorporated herein by reference.

TECHNICAL FIELD

The present invention relates to a generation apparatus, a generation method, a program capable of causing a computer to execute a generation method, and a recording medium recording this program. More specifically, the present invention relates to a generation apparatus and the like for generating a test vector set for a logic circuit.

BACKGROUND ART

As shown in FIG. 14, a semiconductor logic circuit is shipped after going through three phases: design, manufacturing, and test. In the test phase, test vectors in each of which a logic value 0 or 1 is assigned to each logic bit are applied to a manufactured semiconductor logic circuit, a test response from the semiconductor logic circuit is observed, the test response is compared with an expected test response, and a determination as to whether the manufactured semiconductor logic circuit is a non-defective product or a defective product. A non-defective product rate is called "yield" and the yield has a great impact on quality, reliability, and manufacturing cost of semiconductor logic circuits.

Generally, a semiconductor logic circuit is a sequential circuit in most cases. The sequential circuit is configured to include a combinational circuit portion constituted by logic elements such as an AND gate, a NAND gate, an OR gate and a NOR gate, and flip-flops each storing a circuit internal state. In this case, the combinational circuit portion includes primary input lines (PIs), pseudo primary input lines (PPIs), primary output lines (POs), and pseudo primary output lines (PPOs) that are flip-flop input lines. Inputs to the combinational circuit portion include those directly applied from the primary input lines and those applied via the pseudo primary input lines. Further, outputs from the combinational circuit portion include those directly appearing on the primary output lines and those appearing on the pseudo primary output lines.

To test the combinational circuit portion of the sequential circuit, it is necessary to apply required test vectors from the primary input lines and the pseudo primary input lines of the combinational circuit portion to the combinational circuit portion, and to observe a test response from the primary output lines and the pseudo primary output lines of the combinational circuit portion. One test vector is configured to include bits corresponding to primary input lines and pseudo primary input lines, respectively. One test response is configured to include bits corresponding to primary output lines and pseudo primary output lines, respectively.

However, output lines (pseudo primary input lines) and input lines (pseudo primary output lines) of the flip-flops of the sequential circuit are usually inaccessible from outside. Due to this, to test the combinational circuit portion has problems of controllability over the pseudo primary input lines and observability of the pseudo primary output lines.

Scan design is known as a main method of solving the problems of the controllability and the observability confronted by testing of the sequential circuit. The full-scan design means replacing flip-flops by scan flip-flops and generating one or a plurality of scan chains using the scan flip-flops. Operations performed by the scan flip-flops are controlled by a scan enable (SE) signal line. For example, if SE=0, each of the scan flip-flops operates similarly to the conventional flip-flops. If a clock pulse is applied, an output value from each of the scan flip-flops is updated to a value from the combinational circuit portion. Further, if SE=1, one scan flip-flop and another scan flip-flop in the same scan chain form one shift register. If a clock pulse is applied, a new value is loaded to the scan flip-flop through shift-in from the outside and, at the same time, a value currently present in the scan flip-flop is loaded to the outside through shift-out. Normally, the scan flip-flops belonging to the same scan chain share the same scan enable (SE) signal line. The scan flip-flops belonging to different scan chains either share the same scan enable (SE) signal line or use different scan enable (SE) signal lines.

A test is conducted on the combinational circuit portion of a full-scan sequential circuit by repeating scan shift and scan capture. The scan shift is performed in a shift mode in which a scan enable (SE) signal is set to a logic value 1. In the shift mode, one or a plurality of clock pulses is applied and one or a plurality of new values is loaded into the scan flip-flops in each scan chain through shift-in from the outside. At the same time, one or a plurality of values currently present in the scan flip-flops in the scan chain is loaded to the outside through shift-out. The scan capture is performed in a capture mode in which the scan enable (SE) signal is set to a logic value 0. In the capture mode, one clock pulse is applied simultaneously to all the scan flip-flops in one scan chain, and values of the pseudo primary output lines of the combinational circuit portion are loaded into all the scan flip-flops.

The scan shift is used to apply test vectors to the combinational circuit portion via the pseudo primary input lines and to observe a test response from the combinational circuit portion via the pseudo primary output lines. The scan capture is used to load the test response from the combinational test portion into the scan flip-flops. By repeating the scan shift and the scan capture for all the test vectors, the combinational circuit portion can be tested. A test method of this type is called "scan testing".

In the scan testing, application of test vectors to the combinational circuit portion includes direct application of test vectors from the primary inputs and application thereof by means of the scan shift. Since an arbitrary logic value can be set to an arbitrary scan flip-flop by the scan shift, the problem of the controllability over the pseudo primary input lines is solved. Observation of the test response from the combinational circuit portion includes observation made directly by the primary outputs and observation made by means of the scan shift. Since an output value from an arbitrary scan flip-flop can be observed by the scan shift, the problem of the observability over the pseudo primary output lines is solved. In this way, according to the scan testing, it suffices to obtain test vectors and an expected test response using an automatic test pattern generation (ATPG) program.

Despite usefulness of the scan testing, the problem remains that power dissipation is quite high during a test as compared with ordinary operation. If a semiconductor logic circuit is constituted by a CMOS circuit, the power dissipation includes static power dissipation due to leakage current and dynamic power dissipation due to switching activity of logic gates and flip-flops. Moreover, the latter dynamic power dissipation includes shift power dissipation during shift activity and capture power dissipation during capture activity.

Generally, the number of clock pulses applied during the scan shift is large for one test vector. For example, to set new values to all the scan flip-flops in a certain scan chain, it is necessary to apply clock pulses up to those as many as the scan flip-flops. Due to this, the shift power dissipation increases, often resulting in excessive heat. The excessive heat may possibly damage the semiconductor logic circuit. Studies have been actively conducted for methods of reducing the shift power dissipation.

Meanwhile, the number of clock pulses necessary during the scan capture for one test vector is usually one per scan chain. Due to this, the problem of the heat due to the scan capture power dissipation does not occur. However, if the test response from the combinational circuit portion appearing on one pseudo primary output line is loaded into the scan flip-flops and the test response value differs from a value currently present in the scan flip-flop, an output value from the corresponding scan flip-flop changes. If the number of scan flip-flops having changed output values is large, power supply voltage temporarily drops due to switching activities of logic gates and the scan flip-flops. This phenomenon is also called "IR-(I: current and R: resistance) drop phenomenon". The IR-drop phenomenon causes the circuit to malfunction, and a faulted test response value is often loaded into the scan flip-flops. A faulted test result that the semiconductor logic circuit that can operate normally at ordinary time is determined as a defective product in a test is thereby obtained. This results in yield loss. Particularly, if semiconductor logic circuits are increasingly made very large in scale, ultra-fine, and lower in power supply voltage, the yield loss caused by the faulted test result becomes conspicuous. It is, therefore, necessary to reduce capture power dissipation.

If a single clock signal is used during a test, scan capture power dissipation can be reduced using a clock gating scheme. However, the clock gating scheme greatly influences physical design of the semiconductor logic circuit. If multiple clock signals are used during a test, the scan capture power dissipation can be reduced using a one-hot scheme or a multiple-clock scheme. However, since the former scheme greatly increases test data volume and the latter scheme requires considerably high memory dissipation to generate test vectors, the both methods cast heavy burden on the ATPG. Therefore, to reduce the scan capture power dissipation, a scheme with less influence on the physical design, smaller increase in the test data volume, and slighter burden on the ATPG is desirable.

On the other hand, a test cube with don't-care bits logic values of which can be set to either 1 or 0 to achieve a predetermined object such as fault detection frequently appears in the process of generating test vectors according to the ATPG program. By contrast, a test input without don't-care bits including only a logic bit (bit having a logic value 0 or 1) is referred to as the "test vector" as already described. Furthermore, if a set of test vectors without don't-care bits is given, a part of bits of a part of the test vectors can be replaced by don't-care bits without changing the fault coverage of the test vector set. Namely, a test cube can be also obtained by a don't-care bits identification program. A cause for the presence of the test cube is as follows. To detect one or a plurality of target faults in the combinational circuit portion of the full-scan sequential circuit, it suffices to set necessary logic values to a part of bits on the primary input lines and the pseudo primary input lines. Since there is no influence on the detection of the target fault or faults whether 0 or 1 is set to each of the remaining bits, those remaining bits are regarded as don't-care bits for the target fault or faults.

Non-Patent Documents 1 to 3 relate to techniques for replacing a part of bits of a part of a set of test vectors without don't-care bits by don't-care bits without changing the fault coverage of the test vector set.

Non-Patent Document 1 uses a scheme called "Bit-Striping" for checking whether bits can operate as don't-care bits one bit by one bit so as to identify don't-care bits of each test vector. This scheme completely ignores the correlation among the test vectors. This scheme also has a problem that processing time increases in proportion to the number of bits.

According to Non-Patent Document 2, don't-care bits are identified based on a scheme called "XID". Differently from the technique of Non-Patent Document 1, not each test vector but all the test vectors in a given test vector set are simultaneously processed by the XID scheme. Specifically, a fault that can be detected only in each test vector (referred to as "essential fault") is obtained. Next, a logic value setting necessary to detect all essential faults is made by applying implication operation and logic justification of the ATPG. As a result, the other logic bits are replaced by don't-care bits. With this scheme, a simulation is not carried out on all input bits. Due to this, the scheme of Non-Patent Document 2 is more efficient and shorter in test application time than that proposed by Non-Patent Document 1. Nonetheless, no restrictive conditions are set for this don't-care-bit scheme. Namely, with this scheme, every logic bit may possibly be replaced by a don't-care bit.

According to Non-Patent Document 3, similarly to the above-stated Non-Patent Document 2, not each test vector but all the test vectors in a given test vector set are simultaneously processed. The difference of the technique of Non-Patent Document 3 from that of Non-Patent Document 2 is that it is not allowed to replace any of the logic bits by don't-care bits and that don't-care bits are identified only from a part of logic bits (referred to as "candidate bits"). Don't-care bits are not identified from logic bits other than the candidate bits (referred to as "fixed bits"). According to Non-Patent Document 3, don't-care bits are identified under restrictive conditions including candidate bits and fixed bits. The scheme of Non-Patent Document 3 is short in test application time similarly to Non-Patent Document 2. In addition, with the scheme of Non-Patent Document 3, don't-care bits can be identified efficiently for achieving a predetermined object. Obviously, since such object achievement efficiency depends on positions of don't-care bits, it is important to set the restrictive conditions including candidate bits and fixed bits according to the object.

A test cube with don't-care bits is only an intermediate appearing in the process of generating test vectors without don't-care bits. Due to this, it is necessary to assign a logic value 0 or 1 into each don't-care bit in the test cube. At the time of assignment, it is normal to decide a logic value (0 or 1) necessary to achieve a certain object for each don't-care bit. Non-Patent Document 4 relates to a technique for deciding a logic value for each don't-care bit in a test cube with a view of reducing scan capture power dissipation.

According to Non-Patent Document 4, three-valued (logic values 0, 1, and X representing don't-care) simulation is done to a test cube with don't-care bits obtained by various schemes in a combinational circuit portion of a full-scan sequential circuit, and test responses to the test cube are first obtained. Next, bit-pairs each including a pseudo input line bit and a pseudo output line bit are classified into Type-A bit-pairs each with only the pseudo input line bit being a don't-care bit, Type-B bit-pairs each with the pseudo output line bit being a don't-care bit, and Type-C bit-pairs with both the pseudo input line bit and the pseudo output line bit being don't-care bits. These bit-pairs are processed in order one pair by one pair. If a Type-A bit-pair is to be processed, a logic value of the corresponding pseudo output line bit is assigned to the pseudo input line bit that is the don't-care bit. If a Type-B bit-pair is to be processed, justification is performed so that a logic value of the pseudo input line bit appears on the pseudo output line bit that is the don't-care bit, thereby deciding a logic value of each of the don't-care bits in the test cube. If a Type-C bit-pair is to be processed, a logic value is assigned to the pseudo input line and justification is performed on the pseudo output line so that the same logic value (0 or 1) appears on each of the don't-care bits that are both the pseudo input line bit and the pseudo output line bit, respectively, thereby deciding a logic value of each of the don't-care bits in the test cube. Obviously, the assignment technique of Non-Patent Document 4 is characterized in that consideration is given only to one bit-pair including one pseudo input line bit and one pseudo output line bit when deciding the logic value of each of the don't-care bits in the test cube. The logic values thus decided are not necessarily overall optimum value.

[Non-Patent Document 1] R. Sankaralingam and N. A. Touba, "Controlling Peak Power During Scan Testing," Proceedings of IEEE VLSI Test Symposium, pp. 153-159, 2002.

[Non-Patent Document 2] K. Miyase and S. Kajihara, "XID: Don't Care Identification of Test Patterns for Combinational Circuits," IEEE Transactions on Computer-Aided Design, Vol. 23, pp. 321-326, 2004.

[Non-Patent Document 3] K. Miyase, S. Kajihara, I. Pomeranz, and S. Reddy, "Don't Care Identification on Specific Bits of Test Patterns," Proceedings of IEEE/ACM International Conference on Computer Design, pp. 194-199, 2002.

[Non-Patent Document 4] X. Wen, H. Yamashita, S. Kajihara, L.-T. Wang, K. Saluja, and K. Kinoshita, "On Low-Capture-Power Test Generation for Scan Testing," Proceedings of IEEE VLSI Test Symposium, pp. 265-270, 2005.

DISCLOSURE OF THE INVENTION

Problems to be Solved by the Invention

As stated, in full-scan sequential circuit testing, in the capture mode, if a test response from the combinational circuit portion appearing on the pseudo primary output lines is loaded into the scan flip-flops and the test response value differs from values currently present in the scan flip-flop, output values from the flip-flops change. If the number of scan flip-flops having changed outputs is large, due to the switching activity of the logic gates, the IR-drop phenomenon occurs that the power supply voltage temporarily drops. The circuit thereby malfunctions and a faulted test response value is often loaded into the scan flip-flops. A faulted test result that the semiconductor logic circuit that can operate normally at ordinary time is determined as a defective product in a test is thereby obtained. This results in yield loss. Particularly if semiconductor logic circuits are increasingly made very large in scale, ultra-fine, and lower in power supply voltage, the yield loss caused by the faulted test result becomes conspicuous. It is, therefore, necessary to reduce capture power dissipation.

To prevent the above-stated problems, it is important to use test vectors with low capture power dissipation for which vectors the number of differences between logic values loaded from a combinational circuit portion 802 into scan flip-flops 804 and logic values which the scan flip-flops 804 currently contain in FIG. 15 is as small as possible in a test. To generate such test vectors, it is necessary to generate a test cube with don't-care bits by some scheme and to further complete final test vectors by deciding optimum logic values and assignment the logic values into the respective don't-care bits included in the test cube.

A test cube frequently appears in the process of generating test vectors according to the ATPG program. If a set of test vectors without don't-care bits is given, a part of bits of a part of the test vectors can be replaced by don't-care bits without changing the fault coverage of the test vector set. Particularly, to generate a test cube by identifying don't-care bits from the given test vector set is advantageous in application because of less influence on a test generation flow.

However, the conventional techniques for generating a test cube have various problems. With the technique of Non-Patent Document 1, test application time is long and a generated test cube cannot necessarily reduce capture power dissipation efficiently. With the technique of Non-Patent Document 2, test application time is relatively short and more don't-care bits can be identified since the entire test set is processed. However, the generated test cube cannot necessarily reduce capture power dissipation effectively. With the technique of Non-Patent Document 3, a test cube capable of effectively reducing capture power dissipation can be generated by identifying don't-care bits only from a part of logic bits of the test set. However, no mention is given to how to define a don't-care bit identification range restricted by candidate bits and fixed bits.

There is also known a technique for assignment a logic value 0 or 1 into each don't-care bit in a test cube so as to effectively reduce capture power dissipation. In particular, the technique of Non-Patent Document 4 is more effective than the other techniques since the difference in logic value is reduced between the pseudo input line bits and the pseudo output line bits corresponding to each other in view of not only the pseudo input line bits but also the pseudo output line bits. However, with the technique of Non-Patent Document 4, only one bit-pair including one pseudo input line bit and one pseudo output line bit is considered for one time when deciding a logic value (0 or 1) to be embedded into each don't-care bit. Due to this, the logic values thus decided are not necessarily overall optimum values.

While the problem related to reduction in the capture power dissipation has been described so far, similar problems accompanied by restrictions occur to the reduction in test data volume or the fault detection of test data.

The present invention has been made to solve the above-stated problems. It is, therefore, an object of the present invention to provide a generation apparatus generating a test vector set capable of reducing differences in logic value generated before and after scan capture with respect to, for example, output of scan cells included in a full-scan sequential circuit, a generation method, a program enabling a computer to execute the generation method, and a recording medium recording this program.

Means for Solving the Problems

The invention according to claim 1 is a generation apparatus for generating a new test vector set by converting an initial test vector set for a logic circuit, and the logic circuit is a full scan designed sequential circuit, the generation apparatus including: identification means for identifying a target test vector exceeding a predetermined criterion for number of bits whose logic values differ before and after scan capture with respect to outputs from scan cells included in the sequential circuit, from among test vectors in the initial test vector set; and generation means for generating a new test vector reducing the number of bits whose logic values differ before and after scan capture with respect to outputs from the scan cells included in the sequential circuit, and replacing the target test vector identified by the identification means. Specific examples of generation of the new test vector reducing the number of bits whose logic values differ before and after scan capture include generation of the new test vector by assigning logic values to unspecified values (X-bits) present in the test cube so that input and output values of the flip-flops before and after the scan capture are as identical as possible.

The invention according to claim 2 is the generation apparatus according to claim 1, wherein the generation means includes selection means for selecting target faults for the target test vector identified by the identification means, and the generation means generates a new test vector capable of detecting all the target faults selected by the selection means, reducing the number of bits whose logic values differ before and after scan capture with respect to outputs from the scan cells included in the sequential circuit, and replacing the target test vector.

The invention according to claim 3 is the generation apparatus according to claim 2, wherein the selection means classifies the respective faults detected only by the target test vector identified by the identification means into vector essential faults detected only by one target test vector and set essential faults detected by a plurality of target test vectors, selects the vector essential faults as target faults for the target test vector detecting the vector essential faults, and selects the set essential faults as target faults for one of the plurality of target test vectors detecting the set essential faults.

The invention according to claim 4 is the generation apparatus according to any one of claims 1, 2, and 3, wherein the generation means defines a capture conflict representing that a value of a certain pseudo primary input of a combinational circuit corresponding to the sequential circuit and a value of a pseudo primary output corresponding to the pseudo primary input differ in a test generation process for the combinational circuit, aborts the latest logic value assignment when not only a fault detection cannot be achieved but also the capture conflict occurs and performs a backtrack for assigning combinational logic values that are not tried before, and generates the new test vector replacing the target test vector identified by the identification means.

The invention according to claim 5 is a generation apparatus for generating a new test vector set by converting an initial test vector set for a logic circuit, and the logic circuit is a full scan designed sequential circuit, the generation apparatus including: generation means for defining a capture conflict representing that a value of a certain pseudo primary input of a combinational circuit corresponding to the sequential circuit and a value of a pseudo primary output corresponding to the pseudo primary input differ in a test generation process for the combinational circuit, aborting the latest logic value assignment when not only a fault detection cannot be achieved but also the capture conflict occurs and performing a backtrack for assigning combinational logic values that are not tried before, and generating a new test vector that reduces number of bits whose logic values differ before and after scan capture with respect to outputs from scan cells included in the sequential circuit and that replaces the target test vector in the initial test vector set.

The invention according to claim 6 is the generation apparatus according to claim 4 and claim 5, wherein the generation means uses not only a main implication stack for performing a backtrack for the fault detection in the test generation process and a backtrack for avoidance of a state transition but also a restorationimplication stack updated for an operation of restoring a state to a state before performing the backtrack for the avoidance of the state transition with respect to a latest capture conflict when the fault detection becomes impossible.

The invention according to claim 7 is a generation method for generating a new test vector set by converting an initial test vector set for a logic circuit, and the logic circuit is a full scan designed sequential circuit, the generation method including: an identification step of causing identification means to identify a target test vector exceeding a predetermined criterion for number of bits whose logic values differ before and after scan capture with respect to outputs from scan cells included in the sequential circuit, from among test vectors in the initial test vector set; and a generation step of causing generation means to generate a new test vector reducing the number of bits whose logic values differ before and after scan capture with respect to outputs from the scan cells included in the sequential circuit, and to replace the target test vector identified by the identification means.

The invention according to claim 8 is the generation method according to claim 7, wherein the generation step includes a first step of selecting target faults for the identified target test vector; and a second step of generating a new test vector capable of detecting all the selected target faults for the target test vector identified by the identification means, reducing the number of bits whose logic values differ before and after scan capture with respect to outputs from the scan cells included in the sequential circuit, and replacing the target test vector.

The invention according to claim 9 is the generation method according to claim 8, wherein in the first step, the respective faults detected only by the target test vector identified by the identification means are classified into vector essential faults detected only by one target test vector and set essential faults detected by a plurality of target test vectors, the vector essential faults are selected as target faults for the target test vector detecting the vector essential faults, and the set essential faults are selected as target faults for one of the plurality of target test vectors detecting the set essential faults.

The invention according to claim 10 is the generation method according to claim 9, wherein a result based on an operational expression indicating an overlap degree for a reachable logic area between the plurality of faults to be selected is used for a judgment as a target fault of which test vector the set essential faults are selected.

The invention according to claim 11 is the generation method according to any one of claims 7 to 10, wherein in the generation step, a capture conflict representing that a value of a certain pseudo primary input of a combinational circuit corresponding to the sequential circuit and a value of a pseudo primary output corresponding to the pseudo primary input differ in a test generation process is defined for the combinational circuit, the latest logic value assignment is aborted when the capture conflict occurs and performs a backtrack for assigning combinational logic values that are not tried before, and the new test vector replacing the target test vector identified by the identification means is generated.

The invention according to claim 12 is a generation method for generating a new test vector set by converting an initial test vector set for a logic circuit, and the logic circuit is a full scan designed sequential circuit, the generation method including: a generation step of causing generation means to define a capture conflict representing that a value of a certain pseudo primary input of a combinational circuit corresponding to the sequential circuit and a value of a pseudo primary output corresponding to the pseudo primary input differ in a test generation process for the combinational circuit, aborting the latest logic value assignment when not only a fault detection cannot be achieved but also the capture conflict occurs and performing a backtrack for assigning combinational logic values that are not tried before, and generating a new test vector that reduces number of bits whose logic values differ before and after scan capture with respect to outputs from scan cells included in the sequential circuit and that replaces the target test vector in the initial test vector set.

The invention according to claim 13 is the generation method according to claim 11 or 12, wherein in the generation step, not only a main implication stack for performing a backtrack for the fault detection in the test generation process and a backtrack for avoidance of a state transition but also a restoration implication stack list which lists a plurality of restoration implication stacks updated for an operation of restoring a state to a state before performing the backtrack for the avoidance of the state transition with respect to a latest capture conflict when the fault detection becomes impossible are used.

The invention according to claim 14 is the generation method according to claim 13, wherein in the generation step, if the capture conflict occurs, a copy of a current main implication stack is added to a top of the restoration implication stack list as a restoration implication stack corresponding to the capture.

The invention according to claim 15 is the generation method according to claim 13 or 14, wherein the generation step includes a restore step of, when the main implication stack is empty and the restoration implication stack list is not empty, deleting a restoration implication stack present at a top of the restoration implication stack list from the restoration implication stack list and setting the restoration implication stack as a new main implication stack, and resuming test vector generation while ignoring a capture conflict corresponding to the restoration implication stack in subsequent test generation processes.

The invention according to claim 16 is the generation method according to claim 15, wherein the restore step is repeated until the target fault is detected so that the fault coverage obtained in the initial test vector set does not fall.

The invention according to claim 17 is the generation method according to any one of claims 7 to 16, wherein when an unspecified value is included in the new test vector, a logic value is assigned to the unspecified value so as to reduce the number of bits whose logic values differ before and after scan capture.

The invention according to claim 18 is a program capable of causing a computer to execute the generation method according to any one of claims 7 to 17.

The invention according to claim 19 is a recording medium recording the program according to claim 18 so as to be able to cause a computer to execute the program according to claim 18.

Effects of the Invention

According to the present invention, it is possible to reduce differences in logic value generated before and after scan capture more effectively with respect to, for example, output of scan cells included in a full-scan sequential circuit. Scan capture power dissipation can be thereby suppressed, thereby making it possible to avoid a faulted test result. Therefore, reduction in a non-defective product rate at which semiconductor logic circuits operating normally in a normal situation are determined as defective products and aborted can be solved.

Furthermore, a generation apparatus and a generation method according to the present invention do not change a logic circuit test design flow and do not increase a circuit area by addition of hardware. Due to this, it can be said that the generation apparatus and the generation method according to the present invention are quite effective to avoid a faulted test result in capture mode.

Moreover, the generation apparatus and the generation method according to the present invention do not depend on the type of clocks. Due to this, if a single clock signal is used during a test, test data volume does not increase remarkably as in a case of adopting a clock gating scheme, but can be effectively reduced.

Further, since the generation apparatus and the generation method according to the present invention do not reduce the fault coverage of the logic circuit, test data fault detection capability can be effectively improved.

BEST MODE FOR CARRYING OUT THE INVENTION

Hereinafter, embodiments of the present invention will be described.

Referring to FIG. 1, an ordinary full-scan circuit that is a background technique of the present invention will be described.

FIG. 1(a) is a schematic diagram showing a configuration of an ordinary full-scan circuit. This full-scan circuit is configured to include a combinational circuit portion 100 and scan flip-flops 102 of a full-scan sequential circuit. The combinational circuit portion 100 includes primary input lines (PIs), pseudo primary input lines (PPIs) that are output lines of the scan flip-flops, primary output lines (POs), and pseudo primary output lines (PPOs) that are input lines of the scan flip-flops. Test vectors v input to the combinational circuit portion 100 includes vectors <v: PI> directly applied from the primary input lines and vectors <v: PPI> applied via the pseudo primary input lines. The vectors <v: PPI> are set to the scan flip-flops 102 by scan shift. Outputs from the combinational circuit portion 100 include a test response f(v) to the test vectors v, and the test response f(v) is constituted by parts <f(v): PO> directly appearing on the primary output lines and parts <f(v): PPO> appearing on the pseudo primary output lines. The parts <f(v): PPO> are loaded into the scan flip-flops 102 by scan capture.

FIG. 1(b) shows an example of a case in which difference in logic value occurs between before and after the scan capture in the scan flip-flops 102 shown in FIG. 1(a).

In FIG. 1(b), if one bit 'a' that is an element in one test vector <v: PPI> and the test response <f(v): PPO> corresponding to the test vector <v: PPI> have different logic values in one scan flip-flop 102, a logic value difference (hereinafter, referred to as "transition") occurs in a capture mode. The number of transitions with respect to a certain test vector is closely correlated with power dissipation generated in the entire circuit including the combinational circuit portion 100 and resulting from the test vector. Due to this, capture power dissipation can be reduced by reducing the number of transitions with respect to the test vector in the capture mode.

FIG. 2 is a diagram showing concepts of a test cube and a test vector set that form a basis for the present invention and describing an example of test data manipulation. FIG. 3 is a diagram to briefly explain an example of don't-care identification that is presupposition of the present invention.

Referring to FIG. 2, a don't-care bit which may be either the logic value 0 or 1 to achieve a predetermined object such as fault detection is denoted by X. A set of test vectors including v1, v2, and v3 with don't-care bits that can be set as don't-care bits is a test cube. The test cube is obtained by a dynamic scheme for causing don't-care bits during test generation according to ATPG and a static scheme for identifying don't-care bits that can be set as don't-care bits after the ATPG, which static scheme is referred to as "don't-care identification". Logic values are specified in such a test cube (X-Filling), and the test cube is finally obtained as a test vector set including test vectors with logic bits values of which are filled with either logic values 0's or 1's. In the following, the test cube is decided so as to minimize signal value transitions in the capture mode with respect to assignment of logic values to the don't-care bits. It is to be noted that the static scheme is also applicable to a compacted test vector set, thus reducing a test data volume.

Referring to FIG. 3, to make a don't-care identification of identifying bits that are included in the test cube and that can be set as don't-care bits, a fault simulation, implication operation, and justification operation are used and don't-care bits can be identified under restrictions. Generally, the restrictions mean adjusting the fault coverage for a specific fault model. In this case, 60% to 90% of bits can be set as don't-care bits. By contrast, restrictions that the fault coverage is not changed can be given in the following instance. It is to be noted that an initial test vector set can be given as a compact test vector set by dynamic compaction or random assignment.

Next, a configuration of a generation apparatus according to an embodiment of the present invention will be described. FIG. 4 is a schematic block diagram of the generation apparatus according to the embodiment of the present invention.

A generation apparatus 200 is configured to include an initial test vector set generation unit 202, a target test vector identification unit 204, and a test vector set conversion unit 206. The test vector set conversion unit 206 is configured to include a target fault selection unit 208, a test cube generation unit 210, a logic value assignment unit 212, and a final test vector set generation unit 214. Further, input and output data include an initial test vector set 216 (T) and a final test vector set 218 (T'). The initial test vector set 216 is a test vector set generated by the initial test vector set generation unit 202 by means of the ATPG or the like in advance.

A processing performed by the generation apparatus 200 shown in FIG. 4 will be briefly described. When the initial test vector 216 is generated, the target test vector identification unit 204 identifies conversion target test vectors from within the initial test vector set 216. The target fault selection unit 208 selects faults to be detected by the test vectors identified by the target test vector identification unit 204, and classifies the selected faults into vector essential faults and set essential faults. The test cube generation unit 210 generates a test cube so that undetected faults are not present in the selected faults. In the generated test cube, the logic value assignment unit 212 assigns logic values to don't-care bits and the final test vector set generation unit 214 generates a final test vector set.

Faults detected by non-target test vectors other than the conversion target test vectors are also detected. Due to this, test vectors can be generated without reducing the detection rate of the initial test vector set.

Referring to FIG. 5A, a processing performed by the generation apparatus according to the embodiment of the present invention will be described.

FIG. 5A is a processing flow chart for the generation apparatus by a test vector generation scheme according to the embodiment of the present invention.

It is to be noted that LCP (Low Capture Power) means that power dissipation is low in the scan capture mode. The processing performed by the generation apparatus according to the embodiment of the present invention roughly includes two processings: stage 1 and stage 2 shown in FIG. 5A. The stage 1 is a processing in step ST300. As means for generating the initial test vector set T, the conventional stuck-at fault detection ATPG is used. This stuck-at fault detection ATPG generates a test vector set at a minimum size satisfying the fault coverage.

In the stage 2, all test vectors included in the initial test vector set T and causing HCP (High Capture Power) are identified. The "HCP" means that power dissipation is high in the scan capture mode. The test vectors with HCP are replaced by new vectors v" so as to satisfy $CT(v") < c\_limit$.

In this case, as shown in FIG. 5B, $CT(v")$ denotes the number of bits whose logic values differ before and after scan capture using the test vector v" (hereinafter, referred to as "bit transitions"), and c_limit denotes an upper limit value that is the targeted number of bit transitions. If the number of bit transitions is not more than c_limit, the number of bit transitions is a numeric value with which it can be assumed that a faulted test result is not obtained. If the number of bit transitions is not less than c_limit, the number of bit transitions is a numeric value that may cause a faulted test result. This c_limit is decided by estimation of a power dissipation amount in circuit design phase, an empirical rule or the like.

Referring back to FIG. 5A, in step ST300, the initial test vector set generation unit 202 shown in FIG. 4 generates the initial test vector set T using the conventional stuck-at fault detection ATPG. In step ST301, the target test vector identification unit 204 shown in FIG. 4 obtains a test vector set Ttar including all the test vectors included in the initial test vector set T satisfying $CT(v) > c\_limit$ as elements. In a step S302, the target fault selection unit 208 shown in FIG. 4 detect all faults included in at least a fault list Ftar(v) with respect to each test vector v included in the test vector set Ttar and obtains a fault list Ftar(v) for which the fault coverage does not fall.

In step ST303, it is determined whether an unprocessed test vector v is present in Ttar. If an unprocessed test vector v is not present in Ttar, the processing is finished. If an unprocessed test vector v is present in Ttar, the processing goes to next step ST304. Instep ST304, it is determined whether an undetected fault f is included in the fault list Ftar(v) for each test vector v included in each Ttar. If an undetected fault f is included, the processing goes to step ST305.

In step ST305, the test cube generation unit 210 shown in FIG. 4 newly generates a test cube v' with don't-care bits for detecting all faults f included in the fault list Ftar(v) in light of the reduction in scan capture power dissipation by an unspecified value assignment scheme intended for LCP. Back to step ST304, it is determined again whether an undetected fault f is included in the fault list Ftar(v) for each test vector v included in each Ttar. If an undetected fault f is not included, the processing goes to step ST306. In step ST306, the logic value assignment unit 212 shown in FIG. 4 assigns logic values to the don't-care bits included in the test cube v' so as to reduce scan capture power dissipation, thereby obtaining a test vector v" without don't-care bits. In step ST307, the final test vector set generation unit 214 shown in FIG. 4 replaces the test vectors v included in the initial test vector set T by test vectors v", thereby obtaining a final test vector set T'. Through the above-stated processing, the initial test vector set T and the final test vector set T' are equal in the fault coverage but the final test vector set T' is lower than the initial test vector set T in scan capture power dissipation.

In FIG. 5A, the steps ST301, ST302, and ST305 relate to a scheme proposed by the present invention and the remaining steps relate to the conventional scheme.

Next, the processing in step ST301 shown in FIG. 5A will be described in detail.

In the step S301 shown in FIG. 5A, all test vectors included in the initial test vector set T and causing the HCP are identified and a set of those test vectors is stored as Ttar. The purpose is to avoid unnecessary processing on test vectors already achieving the LCP.

Although it is the best to perform this processing based on power dissipation analysis, it may take long time for this analysis-based approach and layout information may not be able to be used at this stage. Accordingly, the test vector v satisfying $CT(v) > c\_limit$ are identified.

The processing in step ST302 shown in FIG. 5A will be described in detail.

In this processing, it is necessary to replace each test vector included in the test vector set Ttar by test vectors achieving the LCP, respectively. It is also necessary to select the fault list Ftar(v) without the reduction in the fault coverage so as to generate new test vectors replacing the test vectors v included in the test vector set Ttar.

In a case of selecting faults, it is necessary to satisfy the following conditions.

(Condition 1) The following expression should include all faults detected only by the test vectors included in the test vector set Ttar. This assures that the fault coverage does not fall.

$$\sum_{v \in Ttar} Ftar(v) \qquad \text{[Formula 1]}$$

(Condition 2) Ftar(v) should include faults easy to detect in the test cube achieving the LCP.

(Condition 3) Ftar(v) should be a set as small as possible.

FIG. 6 shows an example of a result of performing the processing in step ST302 shown in FIG. 5A so as to obtain Ftar(v) satisfying the three conditions of Conditions 1 to 3.

In FIG. 6, it is defined that the initial test vector set T={v1, v2, v3, v4, v5} and that v1, v4, and v5 are test vectors causing the HCP. Namely, Ttar={v1, v4, v5}. In this case, it is assumed that 12 faults are present and fault detection information obtained by fault simulation is shown in FIG. 6. In this case, it is preferable that the number of faults targeted at by the target test vectors is small so as to reduce the number of bit transitions of the target test vectors. Therefore, faults f11 and f12 underlined in FIG. 6 are detected by test vectors v2 and v3 that are not included in the test vector set Ttar. Accordingly, the faults f11 and f12 are excluded from a fault set targeted at by the target test vectors. Namely, a fault set detected only by the test vectors included in the test vector set Ttar is TA={f1, f4 to f10}. This indicates that the fault coverage for the fault list Ftar(v) does not decrease from that obtained from the initial test vector set as long as all the faults included in the TA can be detected.

All the faults included in the TA are classified into two types of faults. Faults of one type are faults detected only by only one test vector included in the test vector set Ttar (hereinafter, referred to as "vector essential fault"). The encircled faults in FIG. 6 are vector essential faults. Faults of the other type are faults that are detected by a plurality of test vectors in the test vector set Ttar and that cannot be detected by a test vector set (T-Tar) obtained by excluding the test vector set Ttar from the initial test vector set T (hereinafter, referred to as "set essential faults"). Faults surrounded by quadrangles are set essential faults.

All the vector essential faults for the test vectors V should be included in the fault list Ftar(v). For example, vector essential faults f1 and f6 need to be included in the Ftar(v1). On the other hand, the set essential faults should be included in the fault list Ftar(v) or in the other fault list for detecting the set essential faults without reducing the fault coverage. For example, f9 is a set essential fault detected by test vectors v1 and v4 and needs to be included in either Ftar(v1) or Ftar(v4).

Each set essential fault is included in such an Ftar(v) as to easily detect faults when a test cube achieving the LCP is newly generated. The following novel concept is used to calculate easiness to detect faults.

It is assumed that two faults fa and fb are present in the full-scan circuit. Sets of pseudo primary inputs (PPIs) structurally reachable from the faults fa and fb are denoted by RI(a) and RI(b), respectively. Sets of pseudo primary outputs (PPOs) structurally reachable from the faults fa and fb are denoted by RO(a) and RO(b), respectively. Overlap degree of PPIs and PPOs reachable from the faults fa and fb are denoted by od(fa, fb) and defined as follows.

$$od(fa, fb) = \sum_{i=a,b} \frac{|RO(a) \cap RO(b)|}{RI(i)} + \sum_{i=a,b} \frac{|RI(a) \cap RI(b)|}{RI(i)} \qquad \text{[Formula 2]}$$

FIG. 7 is a diagram showing a concept of the overlap degree of PPIs and PPOs reachable from the faults fa and fb.

In FIG. 7, if a value of od(fa, fb) is larger, the overlap degree of PPIs and PPOs reachable from the faults fa and fb is larger. FIG. 7 also indicates a probability that it is difficult to reduce the number of bit transitions during the scan capture when generating a test cube for simultaneously detecting the faults fa and fb.

It is assumed that a set essential fault f that is not included in the Ftar(v) at the present time can be detected by the test vectors v for which a fault list at the present time is Ftar(v)= {fn1, fn2, . . . , fnp}. First, od(f, fn1), od(f, fn2), . . . , and od(f, fnp) are calculated and an average overlap degree of PPIs and PPOs reachable from the respective faults is calculated as represented by the following equation.

$$aod(f, Ftar(v)) = \sum_{i=1,2,\ldots,p} od(f, fni)/|Ftar(v)| \qquad \text{[Formula 3]}$$

To decide which test vector is to be used to detect the set essential fault f detected by test vectors vm1, vm2, . . . , and vms, aod(f, Ftar(vm1)), aod(f, Ftar(vm2)), . . . , and aod(f, Ftar(vms)) are calculated, and the fault f is included in the fault list for the test vector having a minimum overlap degree of PPIs and PPOs reachable from each fault is obtained.

For example, in FIG. 6, if a fault list including the set essential fault f9 detected by both v1 and v4 is decided, Ftar(v1) and Ftar(v4) are {f1, f6} and {f4, f7, f8}, respectively. Supposing aod(f9, Ftar(v1))<aod(f9, Ftar(v4)), the set essential fault f9 is included in the Ftar(v1). FIG. 6 shows a final result.

In the embodiment of the present invention, the set essential faults are assigned according to overlap degrees of PPIs and PPOs reachable from the faults fa and fb. Alternatively, the set essential faults may be assigned according to the number of faults detected by each test vector. For example, the numbers of assignment target faults detected by test vectors are compared, and set essential faults are assigned to the smaller number of assignment target faults so that the target numbers of faults are almost equal.

The processing in step ST305 shown in FIG. 5A will be described in detail.

After the target fault list Ftar(v) is obtained for one test vector v causing the HCP, a test cube generation processing for sensing capture power dissipation (hereinafter, referred to as "CA_test_cube_generation (f)") in the step S305 shown in FIG. 5A is performed to generate a test cube achieving the LCP for detecting all the faults in the Ftar(v).

FIG. 8 is a block diagram showing a configuration of the test cube generation unit 210 shown in FIG. 4.

The test cube generation unit 210 is configured to include a backtrack determination processing unit 600, a backtrack processing unit 602, and a test cube generation processing unit 604. The backtrack determination processing unit 600 is configured to include a D conflict detector 606 and a C conflict detector 608. The test cube generation processing unit 604 is configured to include an primary implication (main implication) stack processor 610, a restoration implication stack processor 612, a restoration implication stack list processor 614, an primary implication (main implication) stack 616 (Si), a restoration implication stack 618 (S), and a restoration implication stack list 620 (L(S)). It is to be noted that an expression "main implication" in the claims corresponds to "primary implication" used hereinafter.

In FIG. 8, the backtrack determination processing unit 600 determines whether to perform a backtrack processing based on a test cube v in an initial state. If the backtrack determination processing unit 600 determines not to perform a backtrack processing, the test cube generation unit 604 generates a test cube.

FIG. 9 is a flowchart showing procedures of the CA_test_cube_generation (f) processing.

Generally, the CA_test_cube_generation (f) is based on a PODEM algorithm. According to the present invention, the processing in steps ST702, ST705, ST707, ST708, and ST709 is an improvement from the PODEM algorithm. This improvement is based on two basic concepts of capture conflict (hereinafter, referred to as "C conflict") and restoration implication stack. The CA_test_cube_generation (f) is intended to generate a test cube capable of detecting faults f and, at the same time, to reduce the number of bit transitions with respect to bits in the test cube as much as possible. The improvement will be described in detail below.

A conventionally known combinational circuit ATPG algorithm based on the PODEM algorithm makes backtracking (hereinafter, referred to as "backtrack") when discovering a conflict of fault detection information (hereinafter, referred to as "D conflict") during an X-path-checking. The backtrack will be described generally. In the automatic test generation, the backtrack is performed by searching logic values to be assigned to unspecified values (X-bits) in the test cube one by one. If it is discovered that a certain object such as the fault detection cannot be achieved in the process of this automatic test generation, the backtrack is performed. Specifically, the backtrack is an activity for destroying logic value assignment determined previously and assigning logic values in a combination that is not tried before. The D conflict means that a path with unspecified values for activating paths during the fault detection is not present at a gate of a D front signal line (D frontier) or on any PO or PPO.

In the CA_test_cube_generation (f) according to the embodiment of the present invention, a new backtrack condition of a C conflict as well as the D conflict is introduced.

The C conflict means that a certain PPI and a PPO corresponding to the certain PPI have different values. Occurrence of a C conflict means that a transition occurs before and after the scan capture. The C conflict will be described in detail with reference to FIG. 10.

FIG. 10 is a diagram showing a concept of the C conflict.

In FIG. 10, the number of flip-flops is n and the number of C conflicts is also n. A C conflict on the PPI and PPO signal lines corresponding to an $i^{th}$ flip-flop is Ci. The number of D conflicts is one whichever X-path check fails.

The C conflict is checked in the CA_test_cube_generation (f) in light of the influence of the scan capture power dissipation. A simple discovery method for evaluating the influence of the C conflict Ci is to count gates of the combinational circuit portion reachable from an output of the $i^{th}$ flip-flop in the scan circuit.

Referring back to FIG. 9, it is first determined whether a detection target fault can be detected in step ST700. If a detection target fault can be detected, a test vector set is successfully generated and the processing ends. If a detection target fault cannot be detected, the processing goes to next step ST701. If a D conflict is detected in step ST701 or a C conflict is detected in the step S702, it is determined whether or not the primary implication stack is empty by the CA_test_cube_generation (f) in step ST704. If the primary implication stack is empty and the C conflict occurs, a copy of the current primary implication stack is added to a top of the restoration implication stack list and backtrack is performed in step ST706. However, the D conflict and the C conflict fundamentally differ in the following reasons.

If all search spaces are searched by the D conflict, test generation fails. However, if at least one C conflict occurs before all the search spaces are searched, test generation possibly succeeds when the C conflict is ignored. A test cube generated while ignoring the C conflict can detect detection target faults but cannot reduce the number of bit transitions.

Although the C conflict check is useful to reduce the number of bit transitions, it is necessary to prevent a C conflict that hampers generation of a test cube for target fault detection. In the embodiment of the present invention, therefore, the following two types of implication stacks are prepared. One type is an primary implication stack similar to that used on the conventional PODEM-based ATPG algorithm, used to perform a backtrack for fault detection and a backtrack for avoidance of state transition, and used to manage the search spaces. The other type is a restoration implication stack that is a copy of the primary implication stack generated when a C conflict is discovered, and used for operation of restoring to a state before the backtrack for avoidance of the state transition against the latest capture conflict when the fault detection becomes impossible. Since a plurality of C conflicts possibly occurs, a plurality of restoration implication stacks is possibly present. These stacks are placed in the list called "restoration implication stack list".

If a D conflict is detected in step ST701 or a C conflict is detected in the step S702 shown in FIG. 9, it is determined whether or not the primary implication stack is empty in step ST704. If the primary implication stack is empty, it is determined whether or not the restoration implication stack list is empty in step ST707. If the restoration implication stack is not empty, this means that at least one C conflict occurs and that the C conflict causes a failure in a current test generation processing. In this case, a top of the restoration implication stack list or a nearest stack S is deleted from the restoration implication stack list and is restored as an primary implication stack in step ST708. In next step ST709, a C conflict coincident with the stack S is ignored. A processing in step ST710 is performed to resume the test generation. Through such a processing, a test cube for detecting target faults and, at the same time, reducing the number of bit transitions as much as possible is generated.

If a D conflict is not detected in step ST701 or a C conflict is not detected in step ST702 shown in FIG. 9, a part of the test generation processing based on the PODEM of objective( ) backtrace( ) and imply( )is performed in step ST703. The processing returns to step ST700 in which it is determined again whether or not a detection target fault is detected. Likewise, if the backtrack is performed in step ST706 or the test generation is resumed in step ST710, the processing returns to step ST700 in which it is determined again whether or not a detection target fault is detected.

FIG. 11 shows an example of the process of generating a test cube by the CA_test_cube_generation (f). In FIG. 11, A, B, . . . , and G denote PPIs. It is assumed that backtrace( ) decides logic values of a test cube while generating the test cube in a search order of A to G. It is also assumed that the primary implication stack is PS.

FIG. 11 shows that the PS is set to <A:0, B:1, C:0>(PS=<A: 0, B:1, C:0>) and an instance in which a D conflict occurs. This instance is denoted by "D". At this time, a logic value 1 is assigned to C by a backtrack. Next, the backtrace( )assigns a logic value 0 to D. If PS=<A:0, B:1, C:1, D:0>, a C conflict "C1" occurs. In this case, a copy of the PS denoted by the C conflict "C1" is placed in the restoration implication stack list. Next, a logic value 1 is assigned to D by a backtrack. Likewise, if PS=<A:0, B:1, C:1, D:1, E:0>, a C conflict "C2" occurs. A copy of the PS denoted by the C conflict "C2" is placed in the restoration implication stack list. Finally, the PS becomes empty due to a D conflict.

In FIG. 12, an uppermost stack C2 in the restoration implication stack list is restored as an primary implication stack and the test generation is resumed while ignoring the C conflict C2. As a result of the test generation, the test cube becomes <A, B, C, D, E, F, G>=<0, 1, 1, 1, 0, 1, X>. This test cube not only detects detection target faults but also avoids a transition coincident with the C conflict "C1".

In the embodiment, if an unspecified value is included in a newly generated test vector, a logic value is assigned to the unspecified value so as to reduce the number of bits whose logic values differ before and after scan capture.

Hereinafter, experimental results of the present invention are shown.

The novel scheme for LCP test generation as shown in FIG. 5A was implemented and experiments were conducted on ISCAS' 89 circuits. The results are shown in FIG. 13.

The novel LCP test generation scheme achieved 31.2% reduction in the maximum number of bit transitions in the capture mode on average. This is a greater value than 21.6% shown in the conventional X-filling (X. Wen, H. Yamashita, S. Kajihara, L.-T. Wang, K. Saluja, K. Kinoshita, "On Low-Capture-Power Test Generation for Scan Testing," Proc. VLSI Test Symp., 2005, pp. 265-270). With the scheme according to the present invention, the number of test vectors increases. This is because the order of fault detection is ignored in present implementation and a plurality of test patterns may possibly be generated so as to detect the target fault Ftar(v) for the test vector v. However, this problem could be solved by using the order of fault detection when the initial test vectors are generated.

The present invention has been described so far while being applied to the ATPG algorithm based on the PODEM algorithm. The present invention can be also applied to the other ATPG algorithms such as a D algorithm, a FAN algorithm, an extension D algorithm, a nine-valued method, and an RTP (Reverse Time Processing) method.

BRIEF DESCRIPTION OF THE DRAWINGS

FIG. 6 shows an example of a result of performing a processing in Step ST302 shown in FIG. 5A.

FIG. 13 is a table showing experimental results of the present invention.

DESCRIPTION OF REFERENCE SYMBOLS

200 Generation apparatus
204 Target test vector identification unit
206 Test vector set conversion unit
216 Initial test vector set

DRAWINGS

Figure 1A:
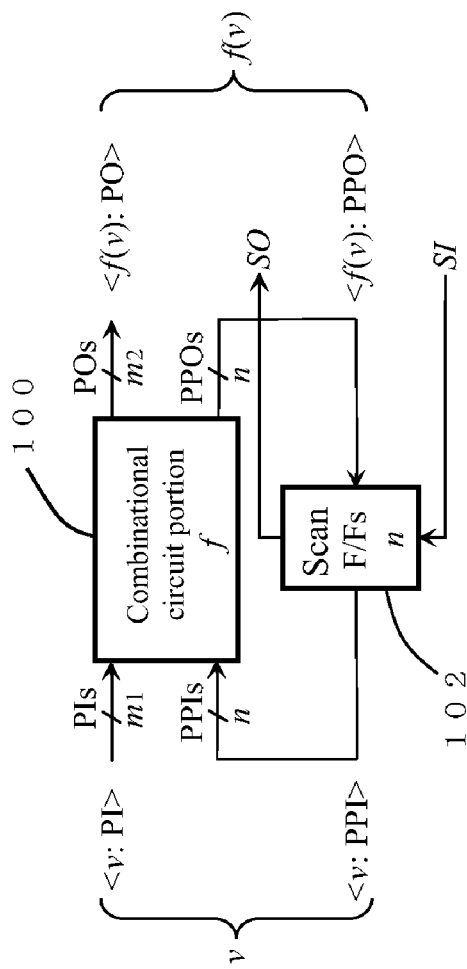
FIG. 1(a) is a schematic diagram showing a configuration of an ordinary full-scan circuit that is a background technique of the present invention.
Figure 1B:
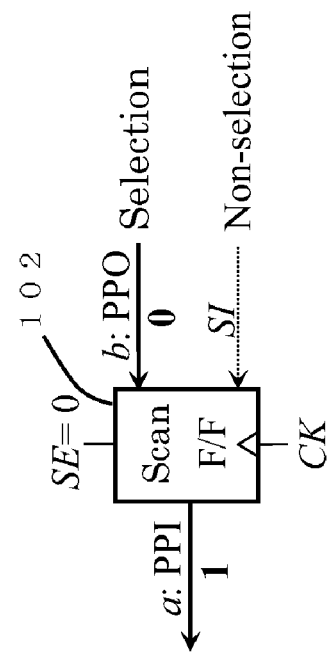
FIG. 1(b) is a schematic diagram of a scan flip-flop that is also a background technique of the present invention.
Figure 2:
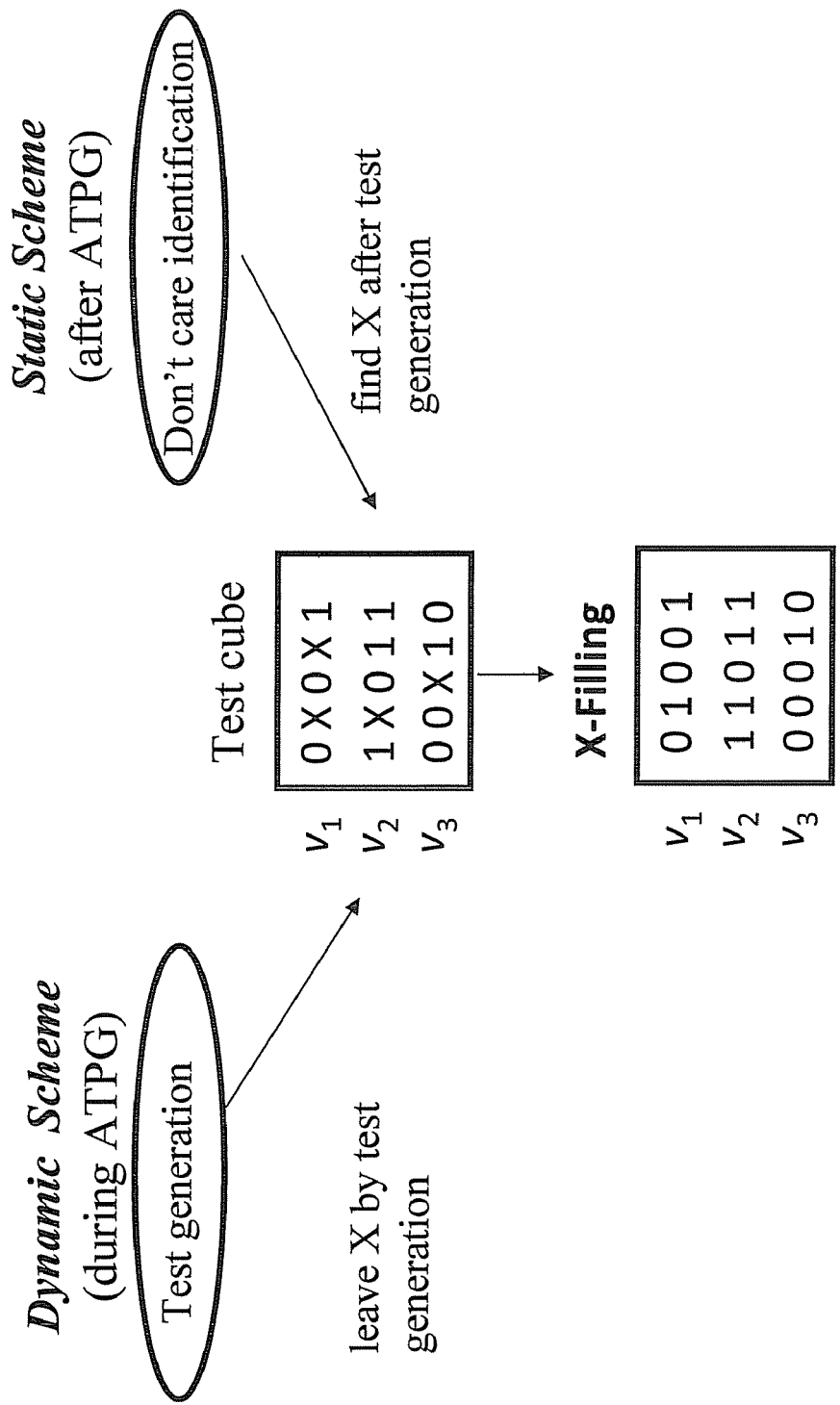
FIG. 2 is a diagram showing concepts of a test cube and a test vector set that form a basis for the present invention and describing an example of test data manipulation.
Figure 3:
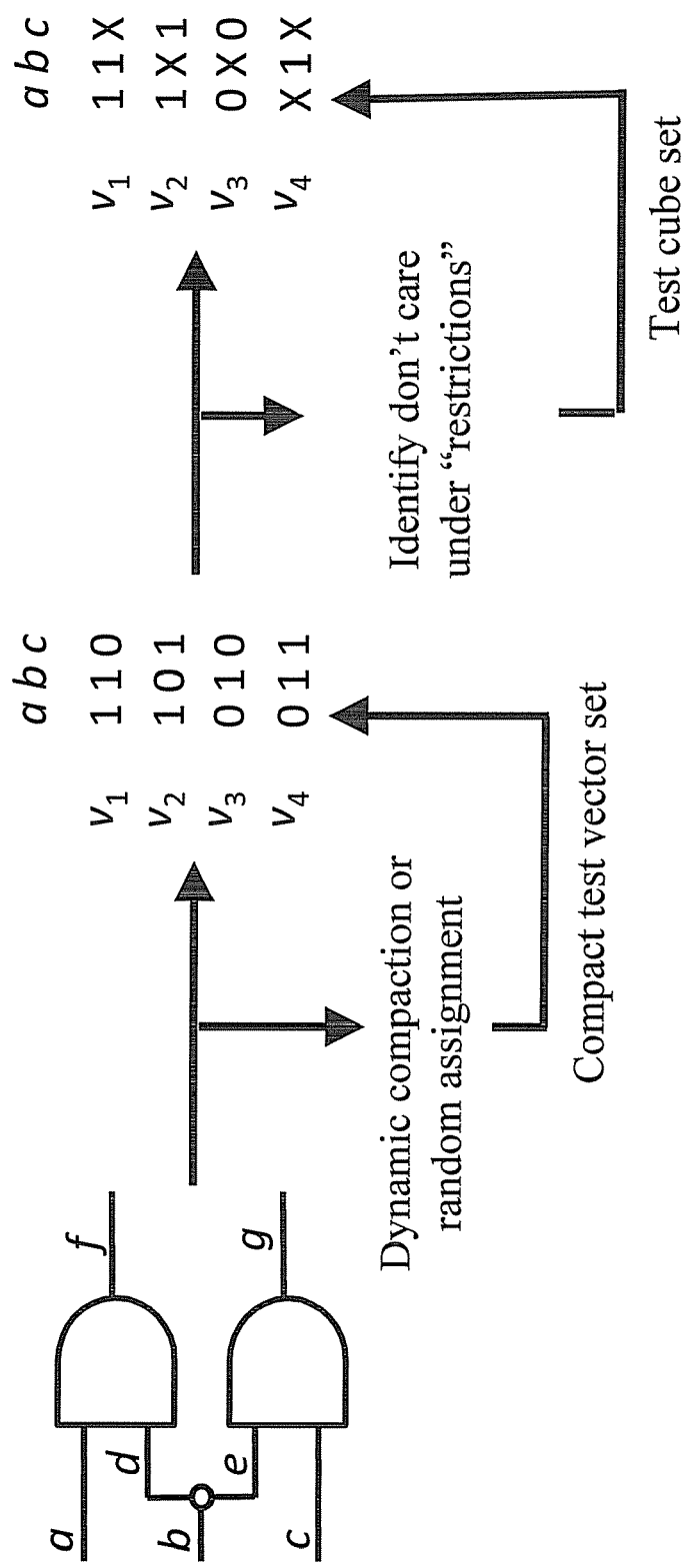
FIG. 3 is a diagram for briefly describing an example of a don't-care identification that forms a basis for the present invention.
Figure 4:
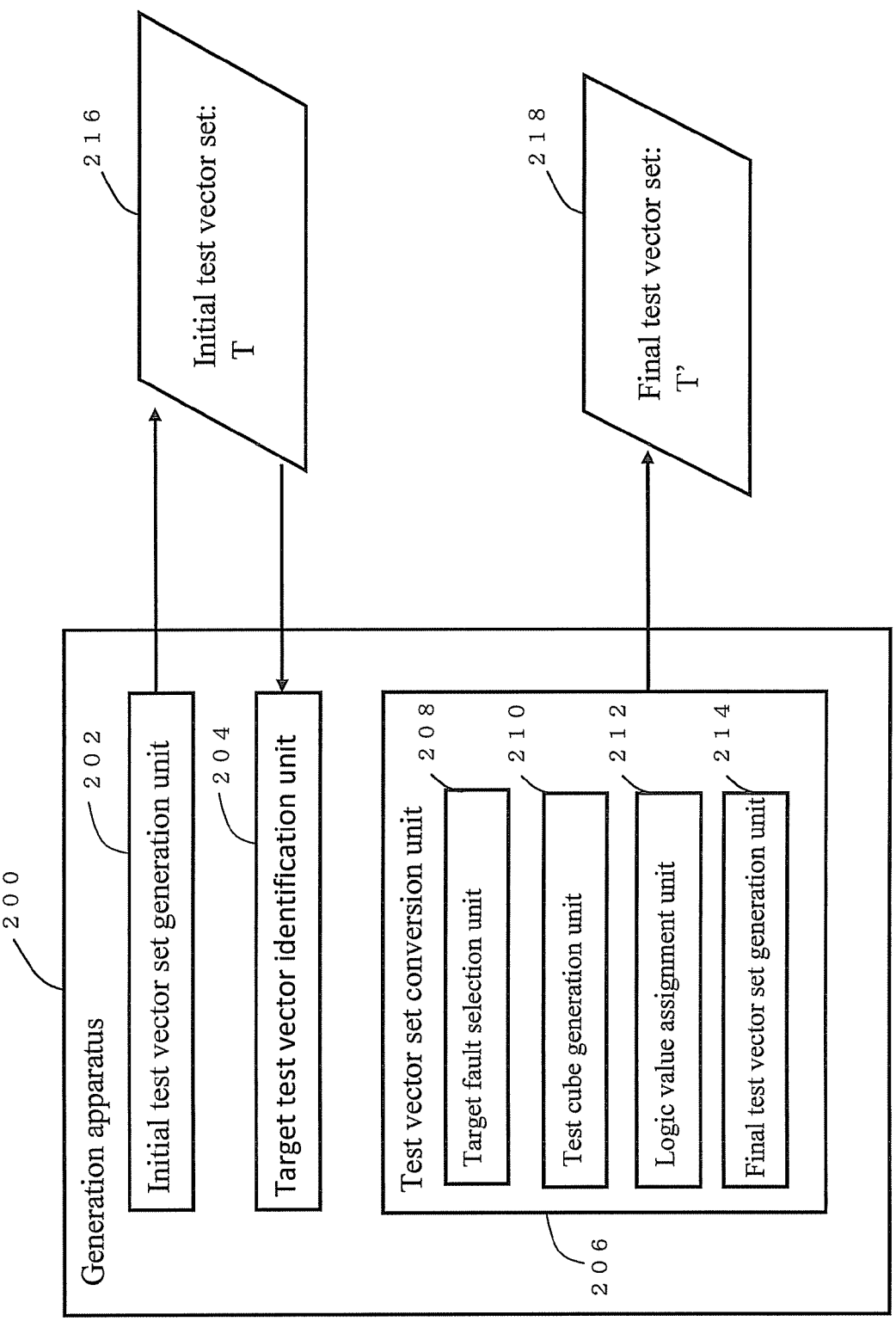
FIG. 4 is a schematic block diagram of a generation apparatus according to an embodiment of the present invention.
Figure 5A:
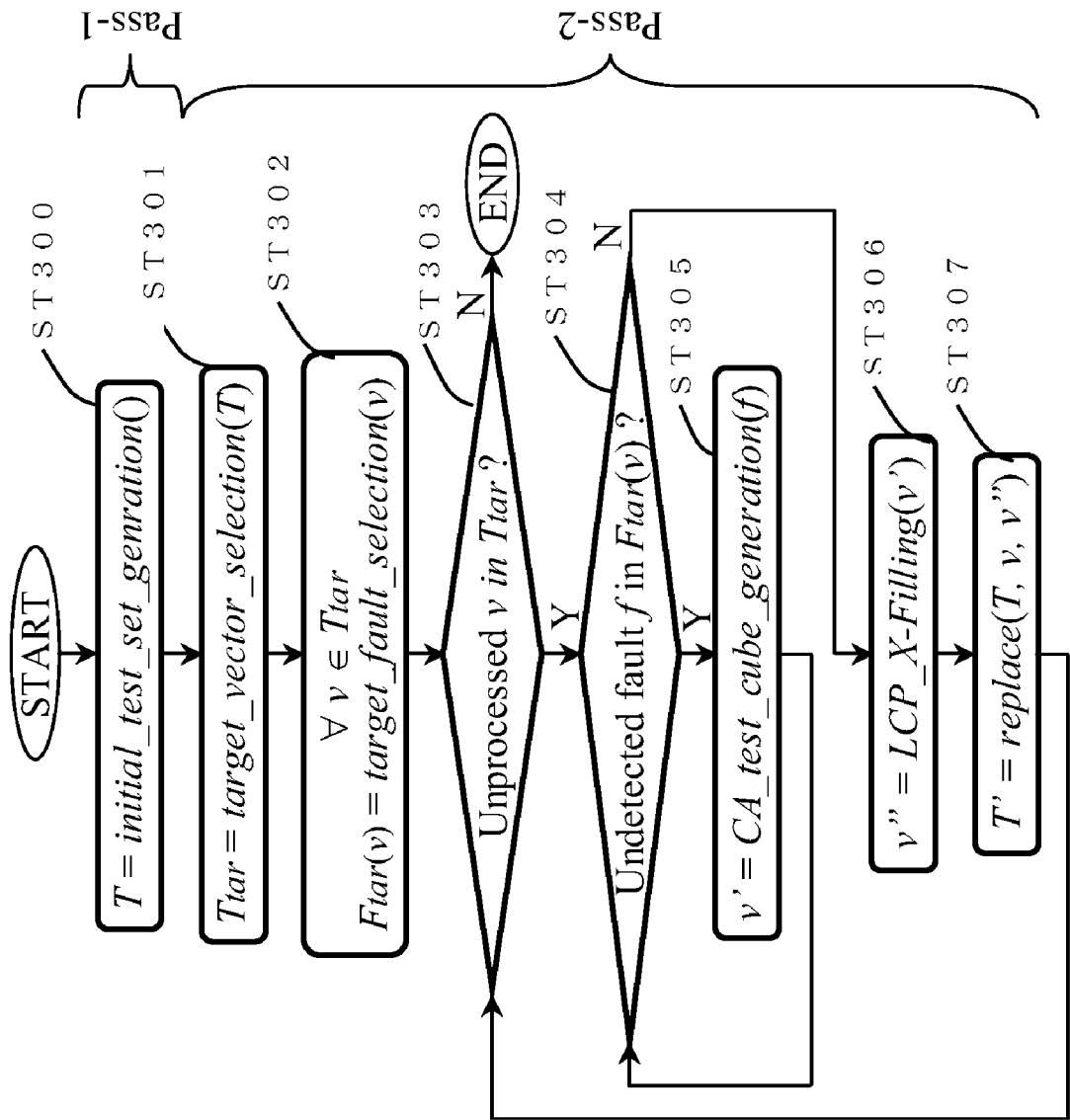
FIG. 5A is a processing flow chart for the generation apparatus by an LCP test vector generation scheme according to the embodiment of the present invention.
Figure 5B:
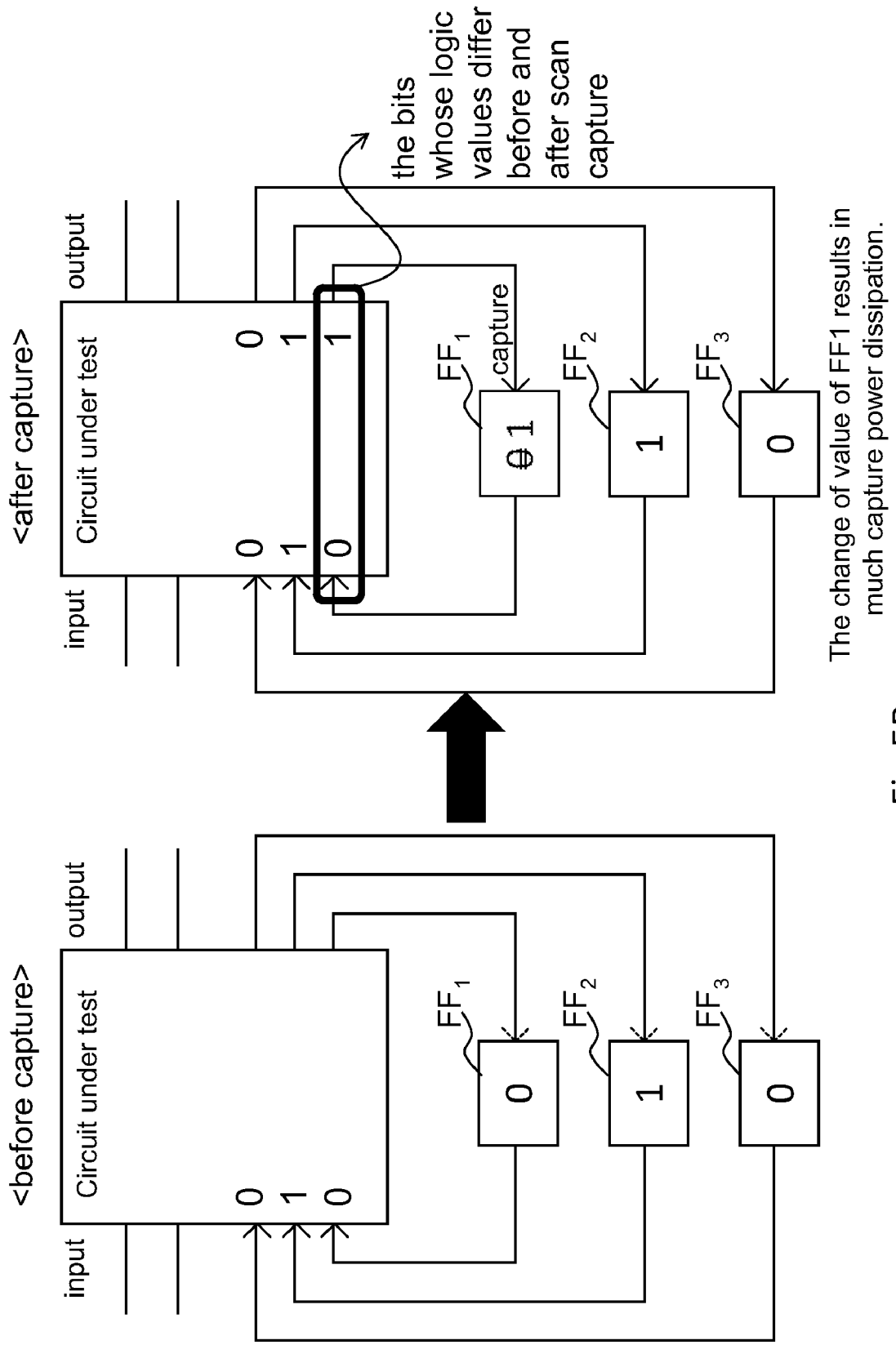
FIG. 5B shows an example of a case where bits whose logic values differ before and after scan capture cause the change of logic values in scan flip-flops, which result in dissipating much capture power. An example of bit transition is the bits in black square and $FF_1$. It is necessary to decrease bit transitions in order to reduce scan capture power dissipation.
Figure 7:
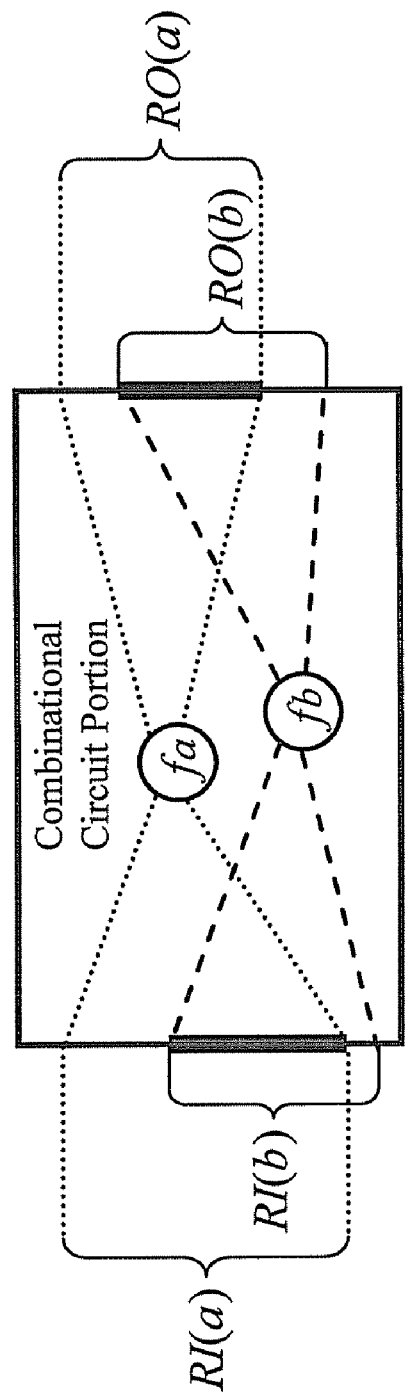
FIG. 7 is a diagram showing a concept of an overlap degree of pseudo primary input (output) line reachable from faults.
Figure 8:
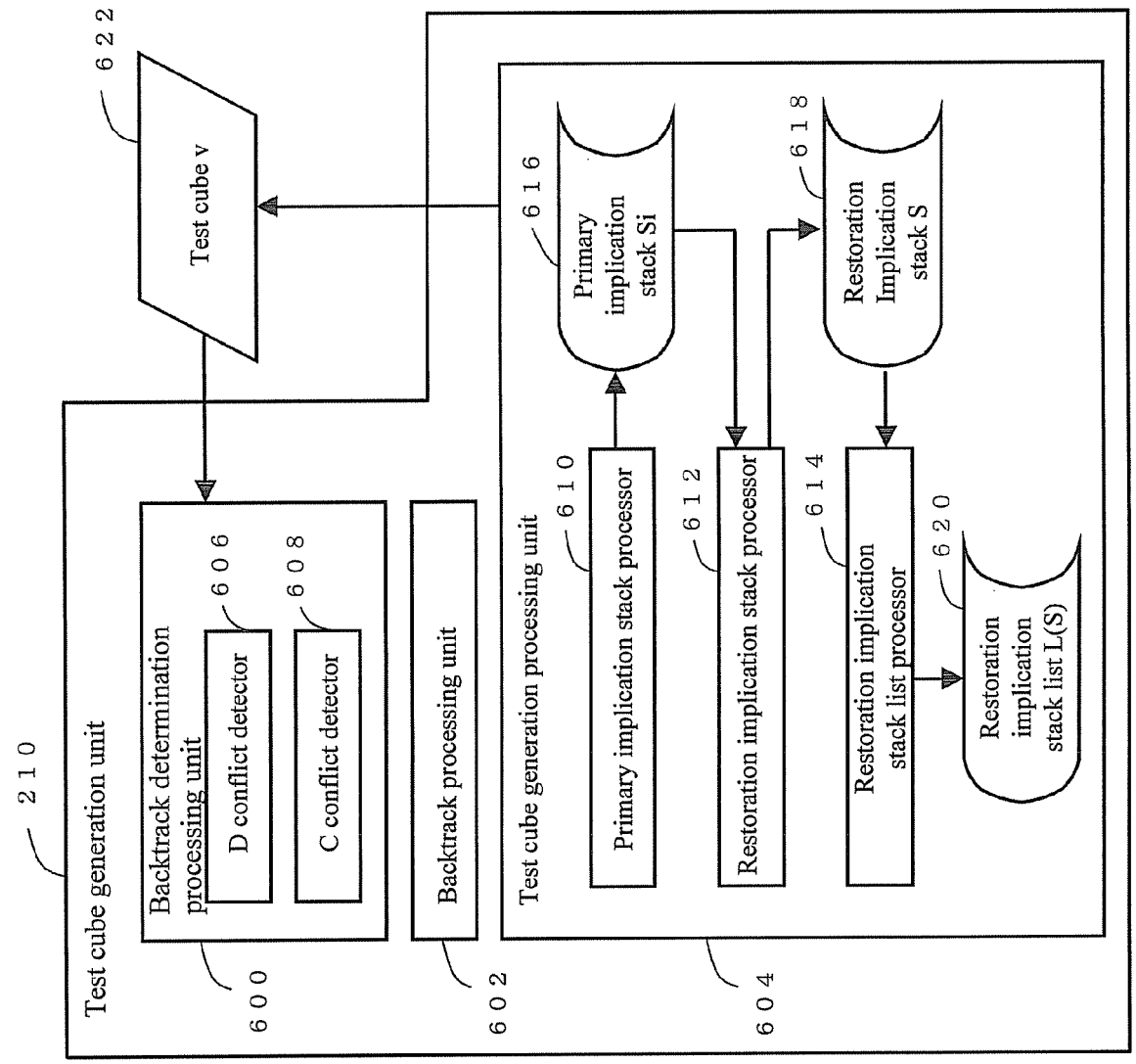
FIG. 8 is a block diagram showing a configuration of a test cube generation unit 210 shown in FIG. 4.
Figure 9:
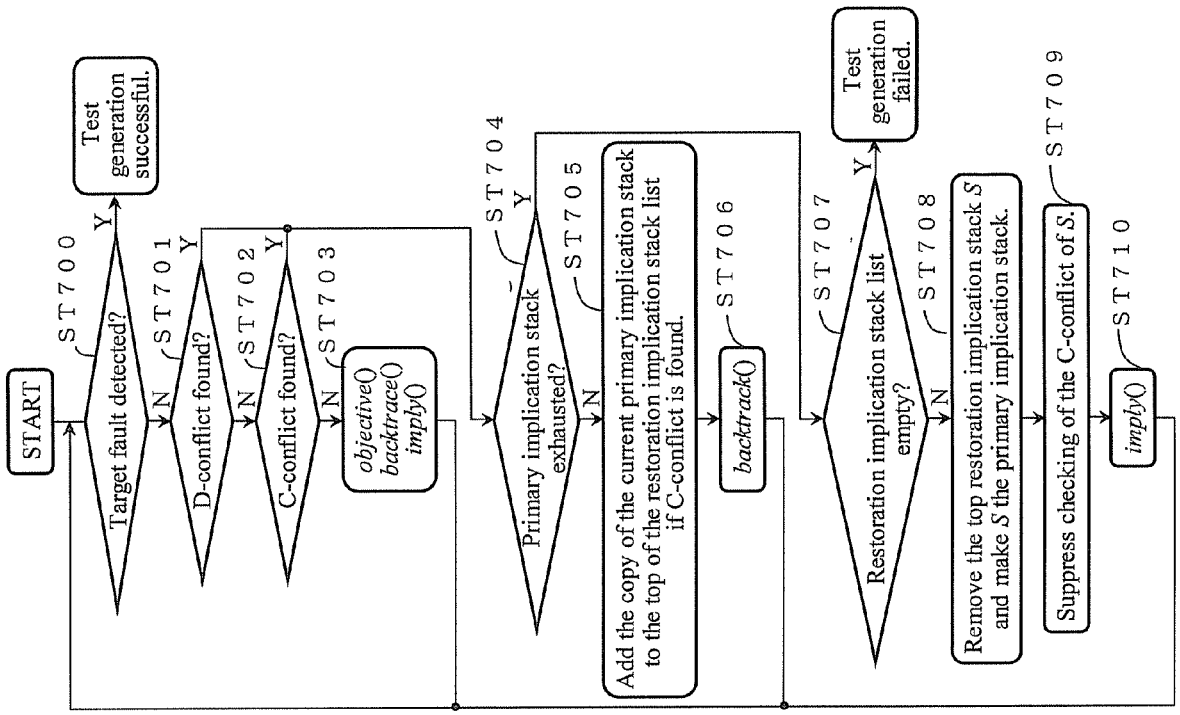
FIG. 9 is a flowchart showing procedures of a CA_test_cube_generation (f) processing.
Figure 10:
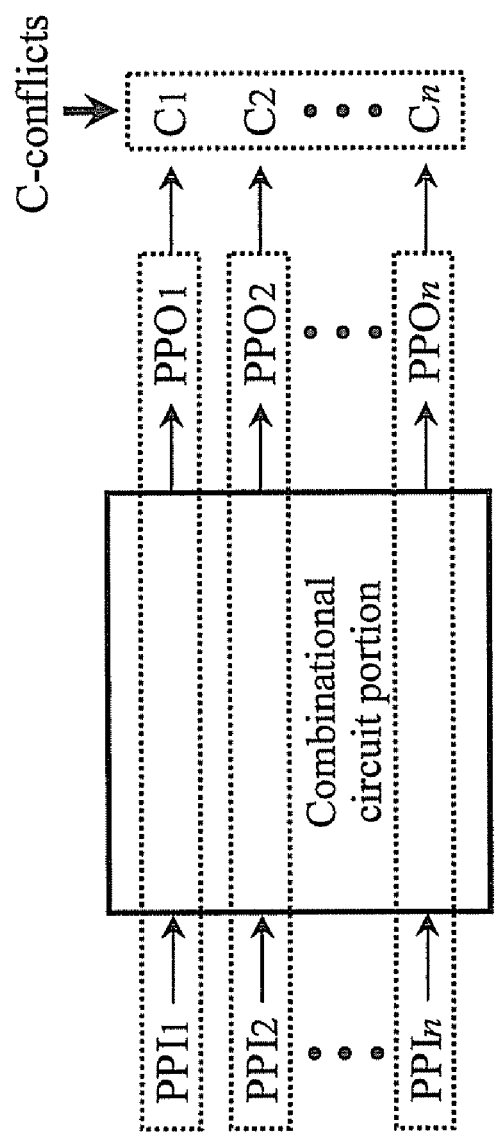
FIG. 10 is a diagram showing a concept of a C conflict.
Figure 11:
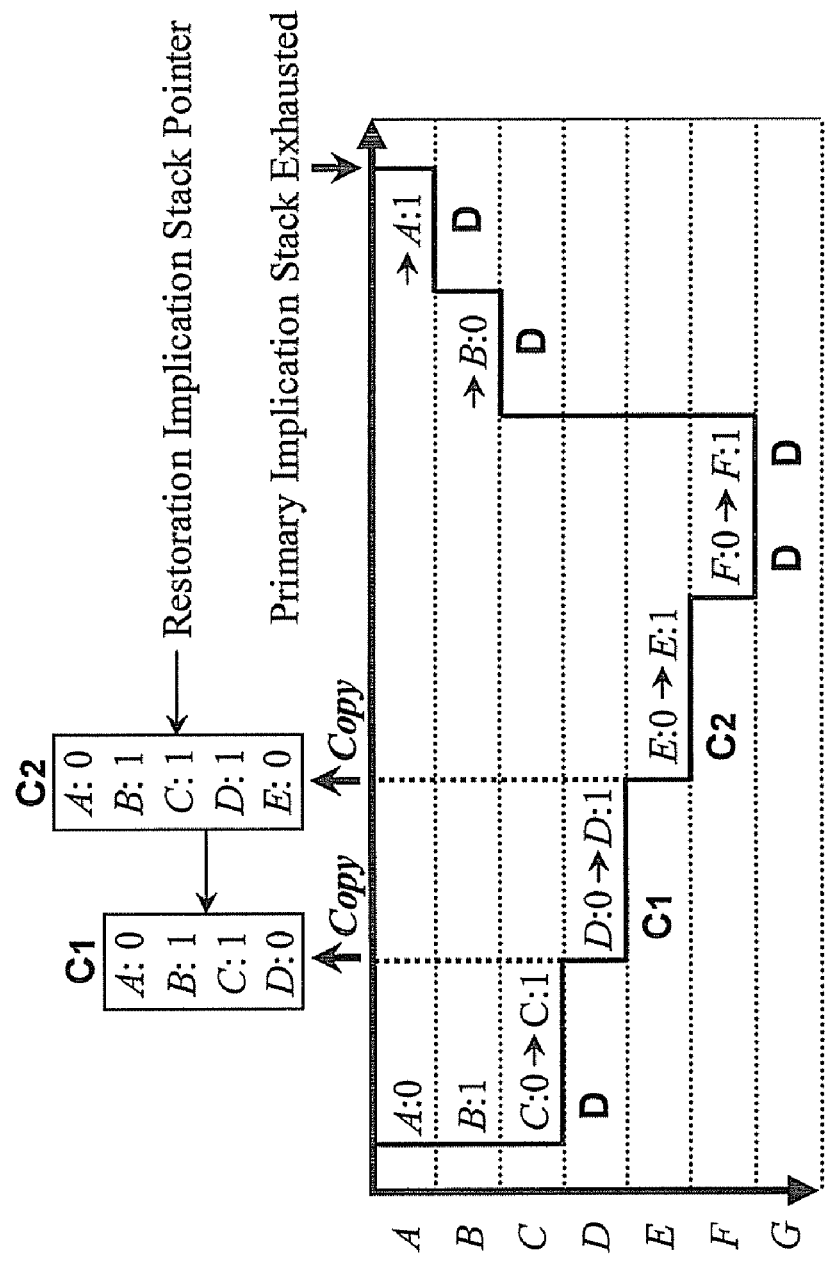
FIG. 11 is a first diagram showing an example of a process of generating a test cube.
Figure 12:
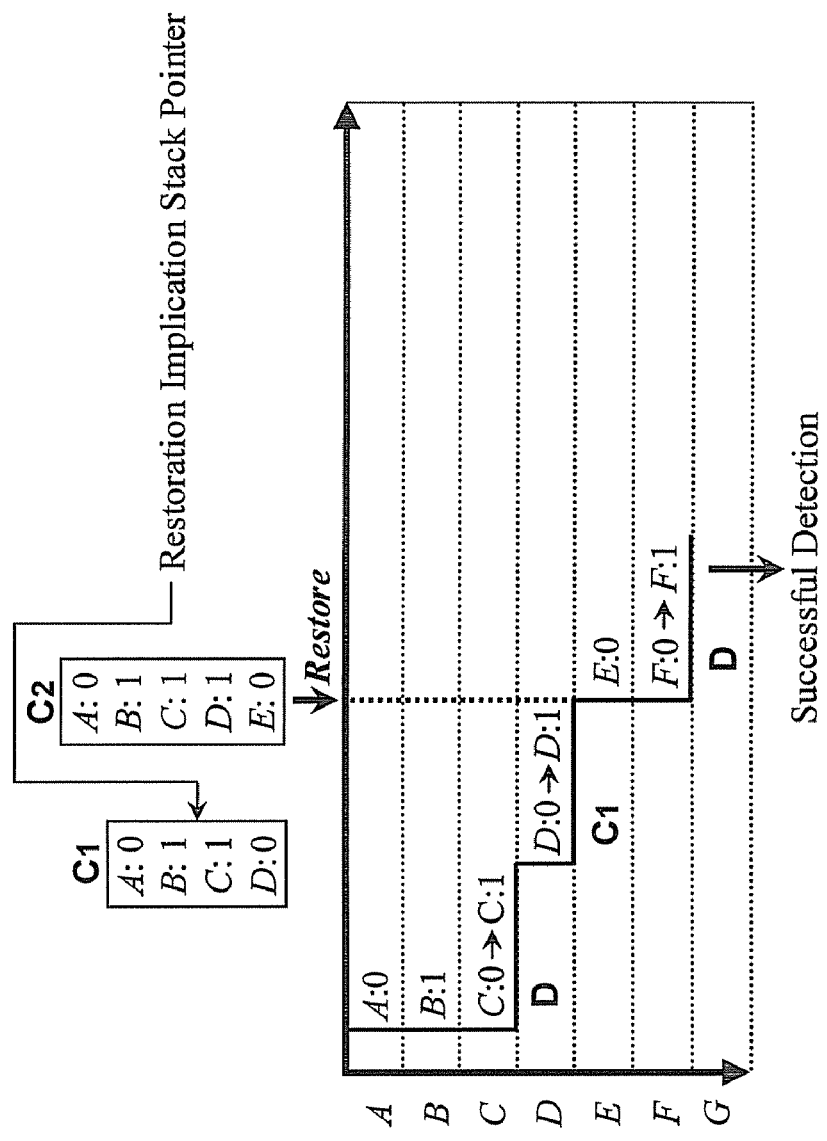
FIG. 12 is a second diagram showing an example of the process of generating a test cube.
Figure 14:
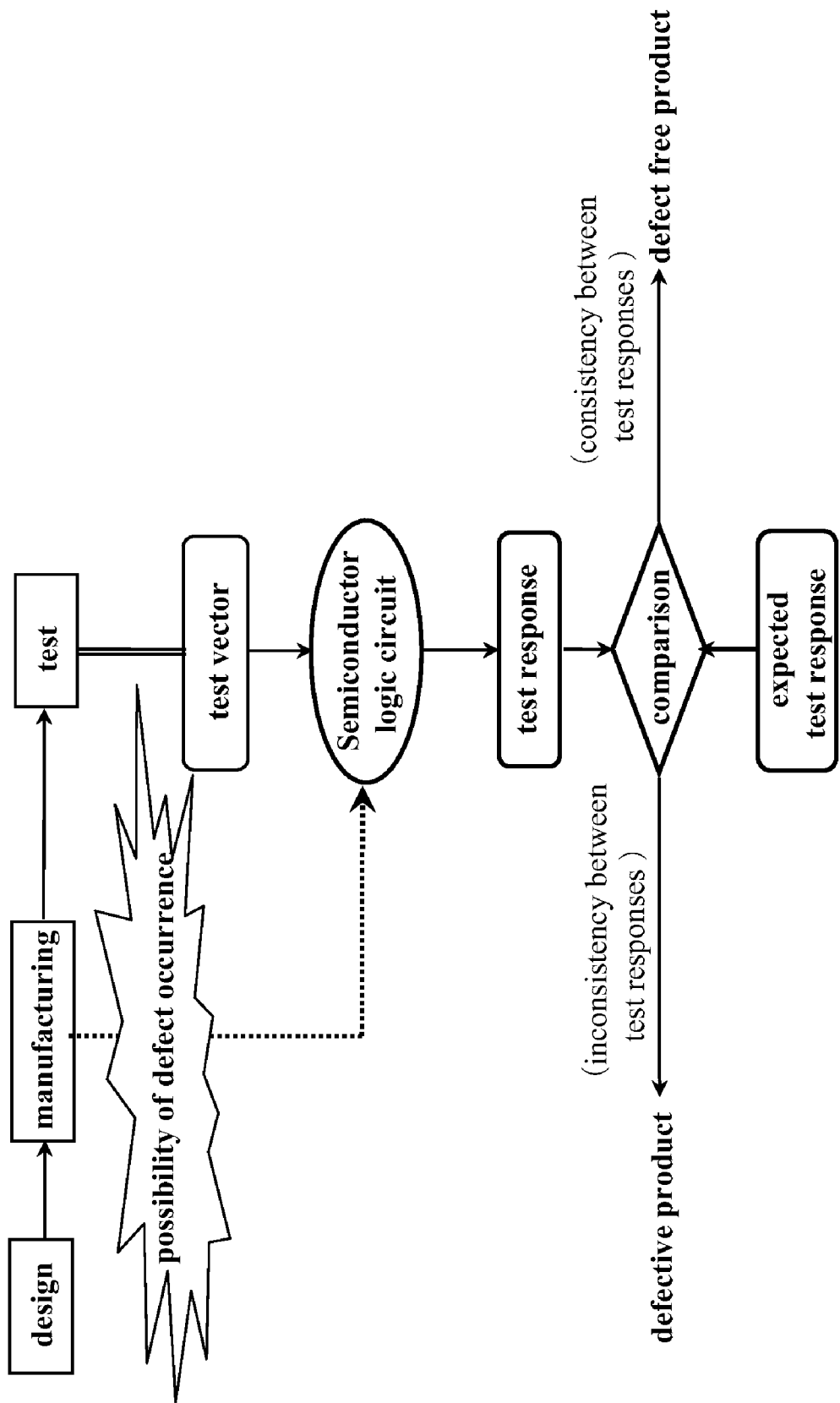
FIG. 14 schematically shows steps before a semiconductor logic circuit is shipped to market.
Figure 15:
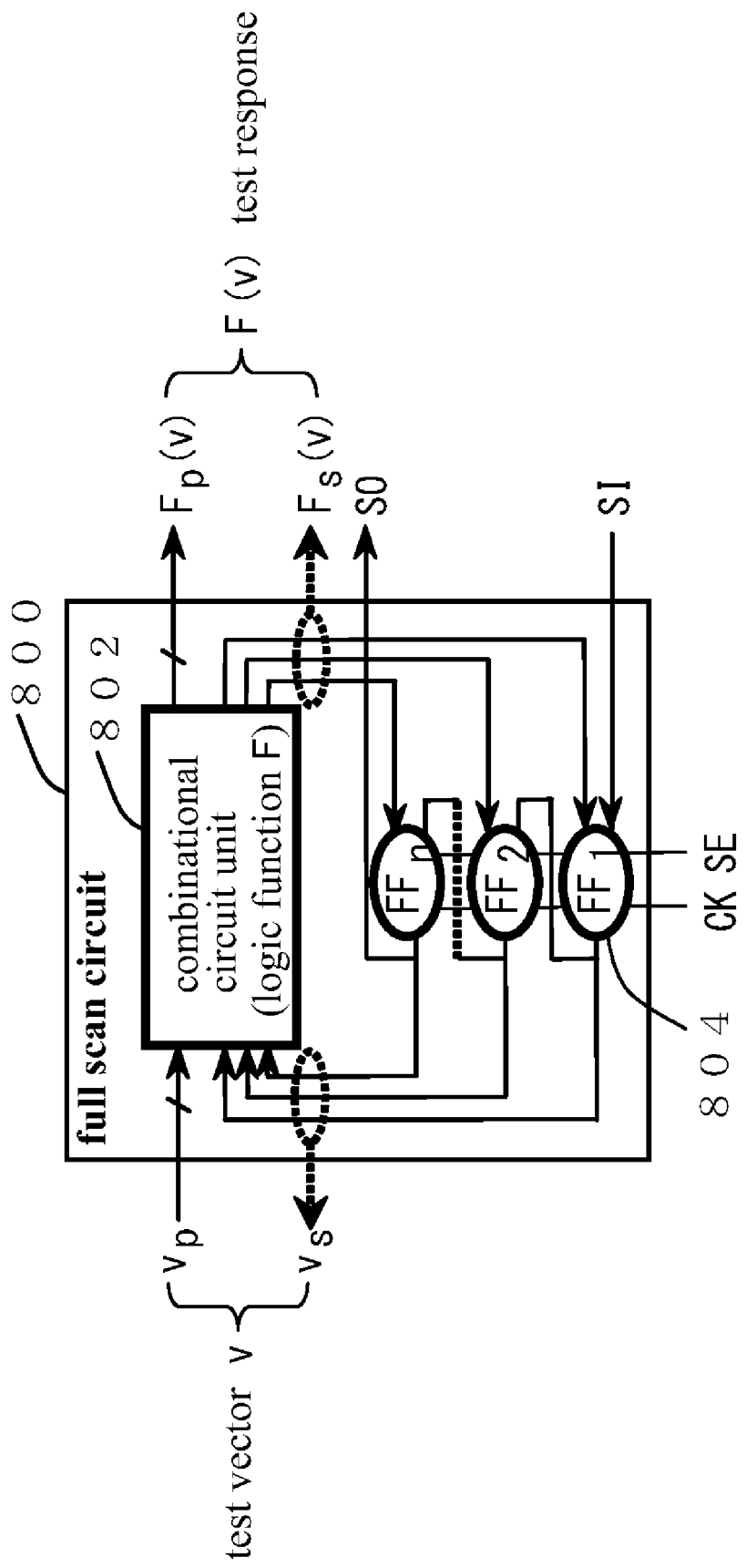
FIG. 15 is a schematic diagram of a full-scan sequential circuit in an ordinary logic circuit.

FIG. 1
1 Combinational circuit portion
2 Scan F/Fs
3 Selection
4 Non-selection
FIG. 2
1 Dynamic scheme (during ATPG)
2 Static scheme (after ATPG)
3 Test generation
4 Don't care identification
5 Test cube
6 Leave x's in test generation
7 Find x's after test generation
FIG. 3
1 Dynamic compaction or random assignment
2 Compact test vector set
3 Make don't care under "restrictions" to identify bits to which x's can be assigned.
4 Test cube set FIG. 4
1 Generation apparatus
2 Initial test vector set generation unit
3 Target test vector identification unit
4 Test vector set conversion unit
5 Target fault selection unit
6 Test cube generation unit
7 Logic value assignment unit
8 Final test vector set generation unit
9 Initial test vector set: T
10 Final test vector set: T'
FIG. 5A
1 Start
2 Is unprocessed v present in Ttar?
3 Is undetected fault f present in Ftar(v)?
4 End
5 Stage 1
6 Stage 2
FIG. 6
1 HCP vector?
2 Fault classification
3 Target fault list Ftar(vi)
4 Vector essential fault
5 Set essential fault
FIG. 7
1 Combinational circuit portion
FIG. 8
1 Test cube generation unit
2 Backtrack determination processing unit
3 D conflict detector
4 C conflict detector
5 Backtrack processing unit
6 Test cube generation processing unit
7 Primary implication stack processor
8 Restoration implication stack processor
9 Restoration implication stack list processor
10 Restoration implication stack list L(S)
11 Test cube v
12 Primary implication stack Si
13 Restoration implication stack S
FIG. 9
1 Start
2 Is detection target fault detected?
3 Does D conflict occur?
4 Does C conflict occur?
5 Success in test generation
6 Is primary implication stack empty?
7 Add copy of current primary implication stack to top of restoration implication stack list if C conflict occurs
8 Is restoration implication stack empty?
9 Delete top of restoration implication stack S to make primary implication stack
10 Ignore C conflict coincident with S
11 Failure in test generation
FIG. 10
1 Combinational circuit portion
2 C conflict
FIG. 11
1 Restoration implication stack pointer
2 Primary implication stack becomes empty
FIG. 12
1 Restoration implication stack pointer
2 Restoration
3 Detection success
FIG. 14
1 Design
2 Manufacturing
3 Test
4 Possibility of fault occurrence
5 Test vectors
6 Semiconductor logic circuit
7 Test response
8 Compare
9 Defective product
10 Discord
11 Accord
12 Non-defective product
13 Expectation test response
FIG. 15
1 Test vectors v
2 Full-scan circuit
3 Combinational circuit portion (logic function F)
4 F(v) test response

What is claimed is:

1. A generation apparatus for generating a new test vector set by converting an initial test vector set for a logic circuit, and the logic circuit is a full scan designed sequential circuit, the generation apparatus comprising:
identification means for identifying, among test vectors in the initial test vector set, a target test vector exceeding a predetermined upper limit value of number of bits whose logic values differ before and after scan capture with respect to outputs from scan cells included in the sequential circuit, the upper limit value under which it can be assumed that a faulted test result is not obtained; and
generation means for generating a new test vector reducing the number of bits whose logic values differ before and after scan capture with respect to outputs from the scan cells included in the sequential circuit, and replacing the target test vector identified by the identification means.

2. The generation apparatus according to claim 1,
wherein the generation means includes selection means for selecting target faults of the target test vector identified by the identification means, the target faults which are faults detected by the target test vector and not detected by test vectors which are not the target test vectors, and
the generation means generates a new test vector capable of detecting all the target faults selected by the selection means, reducing the number of bits whose logic values differ before and after scan capture with respect to outputs from the scan cells included in the sequential circuit, and replacing the target test vector.

3. The generation apparatus according to claim 2,
wherein the selection means classifies the respective faults detected only by the target test vector identified by the identification means into vector essential faults detected only by one target test vector and set essential faults detected by a plurality of target test vectors, selects the vector essential faults as target faults for the target test vector detecting the vector essential faults, and selects the set essential faults as target faults for one of the plurality of target test vectors detecting the set essential faults.

4. The generation apparatus according to claim 1,
wherein the generation means defines a capture conflict representing that a value of a certain pseudo primary input of a combinational circuit corresponding to the sequential circuit and a value of a pseudo primary output corresponding to the pseudo primary input differ in a test generation process for the combinational circuit, aborts the latest logic value assignment when not only a fault detection cannot be achieved but also the capture conflict occurs and performs a backtrack for assigning combinational logic values that are not tried before, and generates the new test vector replacing the target test vector identified by the identification means.

5. The generation apparatus according to claim 4,
wherein the generation means uses not only a main implication stack for performing a backtrack for the fault detection in the test generation process and a backtrack for avoidance of a state transition but also a restoration implication stack updated for an operation of restoring a state to a state before performing the backtrack for the avoidance of the state transition with respect to a latest capture conflict-when the fault detection becomes impossible.

6. A generation apparatus for generating a new test vector set by converting an initial test vector set for a logic circuit, and the logic circuit is a full scan designed sequential circuit, the generation apparatus comprising:
generation means for defining a capture conflict representing that a value of a certain pseudo primary input of a combinational circuit corresponding to the sequential circuit and a value of a pseudo primary output corresponding to the pseudo primary input differ in a test generation process for the combinational circuit, aborting the latest logic value assignment when not only a fault detection cannot be achieved but also the capture conflict occurs and performing a backtrack for assigning combinational logic values that are not tried before, and generating a new test vector that reduces number of bits whose logic values differ before and after scan capture with respect to outputs from scan cells included in the sequential circuit and that replaces the target test vector in the initial test vector set.

7. A generation method for generating a new test vector set by converting an initial test vector set for a logic circuit, and the logic circuit is a full scan designed sequential circuit, the generation method comprising:
an identification step of causing identification means to identify, among test vectors in the initial test vector set, a target test vector exceeding a predetermined upper limit value of number of bits whose logic values differ before and after scan capture with respect to outputs from scan cells included in the sequential circuit, the upper limit value under which it can be assumed that a faulted test result is not obtained; and
a generation step of causing generation means to generate a new test vector reducing the number of bits whose logic values differ before and after scan capture with respect to outputs from the scan cells included in the sequential circuit, and to replace the target test vector identified by the identification means.

8. The generation method according to claim 7,
wherein the generation step includes
a first step of selecting target faults for the identified target test vector; and
a second step of generating a new test vector capable of detecting all the selected target faults of the target test vector identified by the identification means, the target faults being faults detected by the target test vector and not detected by test vectors which are not the target test vectors, reducing the number of bits whose logic values differ before and after scan capture with respect to outputs from the scan cells included in the sequential circuit, and replacing the target test vector.

9. The generation method according to claim 8,
wherein in the first step, the respective faults detected only by the target test vector identified by the identification means are classified into vector essential faults detected only by one target test vector and set essential faults detected by a plurality of target test vectors, the vector essential faults are selected as target faults for the target test vector detecting the vector essential faults, and the set essential faults are selected as target faults for one of the plurality of target test vectors detecting the set essential faults.

10. The generation method according to claim 9,
wherein a result based on an operational expression indicating an overlap degree for a reachable logic area between the plurality of faults to be selected is used for a judgment as a target fault of which test vector the set essential faults are selected.

11. The generation method according to claim 7,
wherein in the generation step, a capture conflict representing that a value of a certain pseudo primary=input of a combinational circuit corresponding to the sequential circuit and a value of a pseudo primary output corresponding to the pseudo primary input differ in a test generation process is defined for the combinational circuit, the latest logic value assignment is aborted when the capture conflict occurs and performs a backtrack for assigning combinational logic values that are not tried before, and the new test vector replacing the target test vector identified by the identification means is generated.

12. The generation method according to claim 11,
wherein in the generation step, not only a main implication stack for performing a backtrack for the fault detection in the test generation process and a backtrack for avoidance of a state transition but also a restoration implication stack list which lists a plurality of restoration implication stacks updated for an operation of restoring a state to a state before performing the backtrack for the avoidance of the state transition with respect to a latest capture conflict when the fault detection becomes impossible are used.

13. The generation method according to claim 12,
wherein in the generation step, when the capture conflict occurs, a copy of a current main implication stack is added to a top of the restoration implication stack list as a restoration implication stack corresponding to the capture.

14. The generation method according to claim 12,
wherein the generation step includes a restoration step of, when the main implication stack is empty and the restoration implication stack list is not empty, deleting a restoration implication stack present at a top of the restoration implication stack list from the restoration implication stack list and setting the restoration implication stack as a new main implication stack, and resuming test vector generation while ignoring a capture conflict corresponding to the restoration implication stack in subsequent test generation processes.

15. The generation method according to claim 14,
wherein the restore step is repeated until the target fault is detected so that the fault coverage obtained in the initial test vector set does not fall.

16. The generation method according to claim 7,
wherein when an unspecified value is included in the new test vector, a logic value is assigned to the unspecified value so as to reduce the number of bits whose logic values differ before and after scan capture.

17. A generation method for generating a new test vector set by converting an initial test vector set for a logic circuit, and the logic circuit is a full scan designed sequential circuit, the generation method comprising:
a generation step of causing generation means to define a capture conflict representing that a value of a certain pseudo primary input of a combinational circuit corresponding to the sequential circuit and a value of a pseudo primary output corresponding to the pseudo primary input differ in a test generation process for the combinational circuit, aborting the latest logic value assignment when the capture conflict occurs and performing a backtrack for assigning combinational logic values that are not tried before, and generating a new test vector that reduces number of bits whose logic values differ before and after scan capture with respect to outputs from scan cells included in the sequential circuit and that replaces the target test vector in the initial test vector set.

18. A generation method, implemented in a computer, for generating a new test vector set by converting an initial test vector set for a logic circuit, and the logic circuit is a full scan designed sequential circuit, the generation method comprising:

an identification step of causing identification means to identify, among test vectors in the initial test vector set, a target test vector exceeding a predetermined upper limit value of number of bits whose logic values differ before and after scan capture with respect to outputs from scan cells included in the sequential circuit, the upper limit value under which it can be assumed that a faulted test result is not obtained; and a generation step of causing generation means to generate a new test vector reducing the number of bits whose logic values differ before and after scan capture with respect to outputs from the scan cells included in the sequential circuit, and to replace the target test vector identified by the identification means.

19. A non-transitory computer readable medium comprising a program which, when executed, performs action for generating a new test vector set by converting an initial test vector set for a logic circuit, and the logic circuit is a full scan designed sequential circuit, the action comprising:

an identification step of causing identification means to identify, among test vectors in the initial test vector set, a target test vector exceeding a predetermined upper limit value of number of bits whose logic values differ before and after scan capture with respect to outputs from scan cells included in the sequential circuit, the upper limit value under which it can be assumed that a faulted test result is not obtained; and a generation step of causing generation means to generate a new test vector reducing the number of bits whose logic values differ before and after scan capture with respect to outputs from the scan cells included in the sequential circuit, and to replace the target test vector identified by the identification means.

\* \* \* \* \*